United States Patent [19]
Kelem

[11] Patent Number: 6,061,417
[45] Date of Patent: May 9, 2000

[54] PROGRAMMABLE SHIFT REGISTER

[75] Inventor: Steven H. Kelem, Los Altos Hills, Calif.

[73] Assignee: Xilinx, Inc., San Jose, Calif.

[21] Appl. No.: 09/204,853

[22] Filed: Dec. 3, 1998

[51] Int. Cl.$^7$ .................................................. G06M 3/00
[52] U.S. Cl. ................................ 377/26; 377/69; 377/80; 377/81
[58] Field of Search ................................ 377/69, 80, 81, 377/26

[56] References Cited

U.S. PATENT DOCUMENTS

| | | | |
|---|---|---|---|
| 5,014,244 | 5/1991 | Lammerts et al. | 377/69 |
| 5,367,551 | 11/1994 | Okumura et al. | 377/81 |
| 5,481,749 | 1/1996 | Grondalski | 377/69 |
| 5,589,787 | 12/1996 | Odinot | 377/72 |
| 5,761,266 | 6/1998 | Watts, Jr. | 377/81 |

OTHER PUBLICATIONS

Hackett and Leach, "Build Better Sequential Circuits", ASIC and EDA, Mar. 1992, pp. 43–49.

*Primary Examiner*—Margaret R. Wambach
*Attorney, Agent, or Firm*—Patrick T. Bever; Jeanette S. Harms

[57] ABSTRACT

A programmable shift register in which the length (e.g., number of bits), number and location of taps, operating mode (i.e., counting up/down) and number of skip states are configured by programming selected memory cells. The programmable shift register includes a plurality of flip-flops, a programmable interconnect circuit, a next-state control circuit and a mode control circuit. The output terminal of each flip-flop drives a different bus line in the programmable interconnect circuit. Each bus line is programmably connected to a plurality of I/O lines via programmable interconnect points (PIPs). At least two of the second lines are connected to the input terminal of each flip-flop via portions (e.g., multiplexers) of the mode control circuit. Programming the PIPs to link selected flip-flop input and output terminals forms one or more shift registers of a selected length. The mode control circuit is programmable such that the shift register loads an initial operating state, or to implements bi-directional (count up/down) control. Some of the I/O lines of the programmable interconnect circuit are connected to the next-state control circuit. The next-state control circuit includes a sequence circuit, a maximal count circuit and a skip-state circuit, all of which are programmable to utilize the output signals from the flip-flops that are transmitted on the first bus.

21 Claims, 13 Drawing Sheets

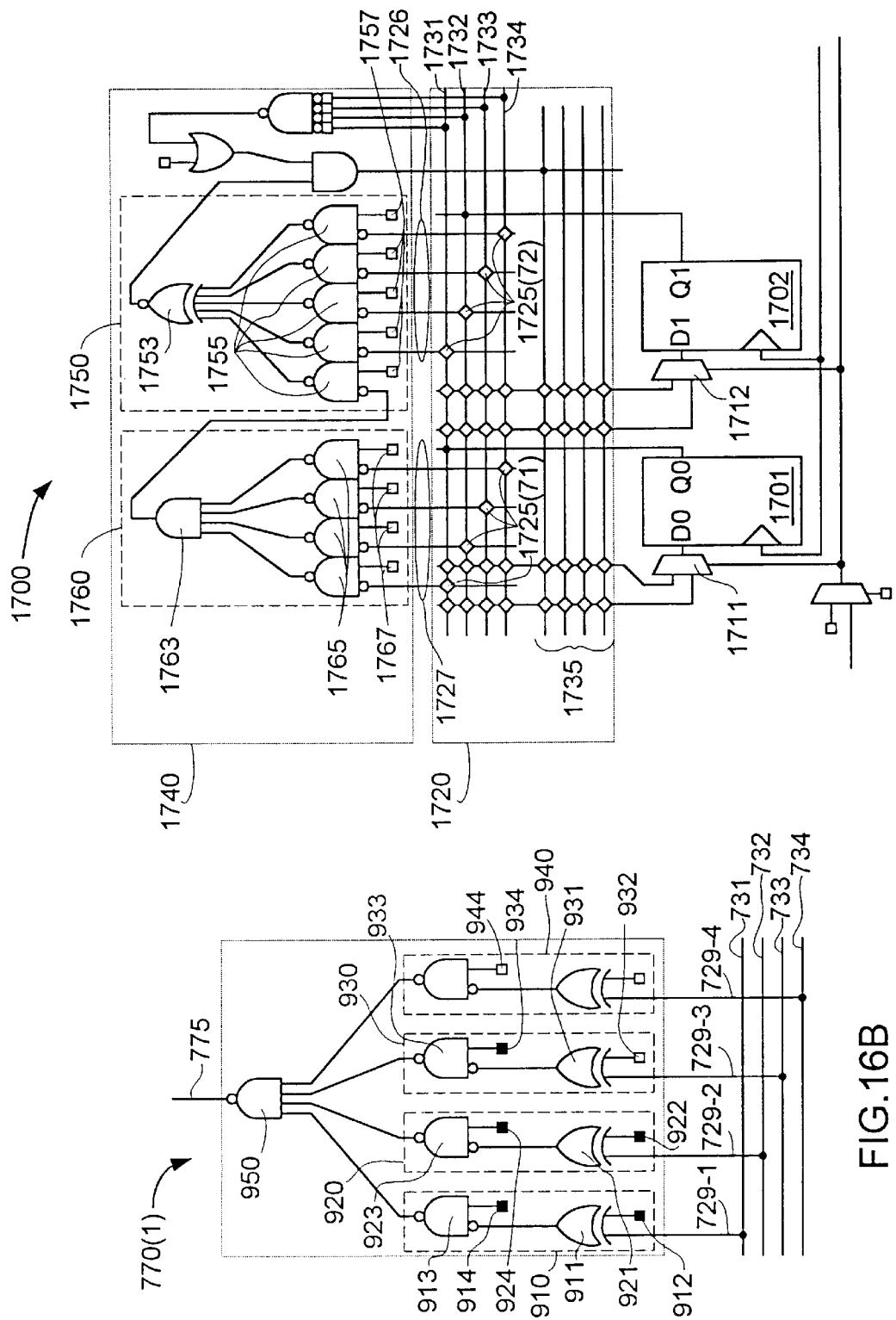

PROGRAMMABLE SHIFT REGISTER

FIELD OF THE INVENTION

The invention relates to digital logic circuits, and more particularly to shift registers.

BACKGROUND OF THE INVENTION

Shift registers are circuits used, for example, in computers, calculators and storage devices that include a cascade-connected series of stages (typically implemented by flip-flops) such that binary data values are shifted from stage to stage in the series.

Linear Feedback Shift Registers (LFSRs) are a type of shift register used, for example, in encryption and fast counter applications. Conventional LFSRs are fixed-length (i.e., a fixed number of flip-flops) shift registers and include a sequence control circuit (typically including an XNOR logic gate) that receives operational state information from several taps in the series of stages, and feeds binary values to the least-significant bit (LSB) stage. Conventional LFSRs are sold as discrete devices, but are also incorporated into programmable logic devices (PLDs) and application specific integrated circuits (ASICs).

The operational state of an LFSR at a point in time is determined by the binary values stored in each stage (e.g., the output signals of its flip-flops) at that point in time. At each CLOCK pulse, data is shifted from one state to the next in the series, thereby creating a sequence of operational states. Each subsequent operational state is controlled by the sequence control circuit, which transmits a binary value to the LSB stage in accordance with the binary values generated at the taps when data is shifted between the stages. Therefore, a sequence of operational states is generated that repeats in a cycle. For a given LFSR, the number and sequence of operational states in this cycle is determined by the number of stages (flip-flops), the number and location of taps and the sequence control circuit logic of the LFSR.

LFSRs are used to form encryption schemes because, when two identical LFSRs are initially in a first operational state, both LFSRs will enter a second operational state after a selected number of data shifts. This facilitates encryption because the cycle of large LFSRs includes millions (or more) of operational states, thereby making it very difficult for a third party to decipher the encryption scheme.

The concepts introduced above are explained in further detail with reference to the simplified LFSR examples shown in FIGS. 1 through 6. These examples depict conventional LFSRs with only four stages for explanatory purposes. LFSRs may be of any length, and often include 128 stages or more when used in encryption applications. Although the conventional LFSRs shown in FIGS. 1 through 6 include only four stages, the following description is consistent with LFSRs having many more stages.

Referring to FIG. 1, LFSR 100 includes four flip-flops 101 through 104 and an XNOR gate 110 that are wired as a shift-right shift register. The Q0 output terminal of flip-flop 101 is connected to the D1 input terminal of flip-flop 102, the Q1 output terminal of flip-flop 102 is connected to the D2 input terminal of flip-flop 103, and the Q2 output terminal of flip-flop 103 is connected to the D3 input terminal of flip-flop 104. The taps of LFSR 100 are located at the Q2 and Q3 output terminals of flip-flops 103 and 104, respectively, and are connected to the input terminals of XNOR gate 110. XNOR gate 110 forms the sequence control circuit of LFSR 100, and transmits an output signal to the D0 input terminal of LSB flip-flop 101. The clock input terminal of each flip-flop 101 through 104 receives a CLOCK signal.

During operation, LFSR 100 shifts through fifteen (15) operational states in a sequence that is controlled by the sequence control circuit (XNOR gate 110). If a first operational state is defined when all flip-flops 101 through 104 are reset (i.e., their output signal is binary zero), a subsequent clock pulse causes LFSR 100 to shift the zero values from flip-flops 101 through 103 into flip-flops 102 through 104, respectively. In addition, the zero values in flip-flops 103 and 104 are combined in XNOR gate 110 to generate a binary one output signal that is transmitted to flip-flop 101. The reset operational state and subsequent operational state are respectively entered as operational states 0 (zero) and 1 (one) in Table 1 (below). The remaining operational states 2 through 14 of the cycle associated with LFSR 100 are similarly generated and are also shown below in Table 1.

TABLE 1

| STATE | Q3 | Q2 | Q1 | Q0 | STATE | Q3 | Q2 | Q1 | Q0 |
|---|---|---|---|---|---|---|---|---|---|
| 0 | 0 | 0 | 0 | 0 | 8 | 1 | 1 | 0 | 0 |
| 1 | 0 | 0 | 0 | 1 | 9 | 1 | 0 | 0 | 1 |
| 2 | 0 | 0 | 1 | 1 | 10 | 0 | 0 | 1 | 0 |
| 3 | 0 | 1 | 1 | 1 | 11 | 0 | 1 | 0 | 1 |
| 4 | 1 | 1 | 1 | 0 | 12 | 1 | 0 | 1 | 0 |
| 5 | 1 | 1 | 0 | 1 | 13 | 0 | 1 | 0 | 0 |
| 6 | 1 | 0 | 1 | 1 | 14 | 1 | 0 | 0 | 0 |
| 7 | 0 | 1 | 1 | 0 | | | | | |

FIG. 2 shows a four-bit LFSR 200 in which the sequence control circuit is modified to generate sixteen operational states. LFSR 200 includes flip-flops 201 through 204, a three-input XNOR gate 210 and a three input AND gate 220. XNOR gate 210 and AND gate 220 form the sequence control circuit of LFSR 200. Similar to LFSR 100, the Q0 output terminal of LSB flip-flop 201 is connected to the D1 input terminal of flip-flop 202, the Q1 output terminal of flip-flop 202 is connected to the D2 input terminal of flip-flop 203, and the Q2 output terminal of flip-flop 203 is connected to the D2 input terminal of flip-flop 204. The output terminals Q0, Q1 and Q2 of flip-flops 201, 202 and 203 are respectively connected to the input terminals of AND gate 220. In addition, the output terminals Q2 and Q3 of flip-flops 203 and 204 are connected to two of the three input terminals of XNOR gate 210, and the output terminal of AND gate 220 is connected to the third input terminal of XNOR gate 210. The output terminal of XNOR gate 210 is connected to the D0 input terminal of flip-flop 201. The clock input terminal of each flip-flop 201 through 204 receives a CLOCK signal.

LFSR 200 operates in a manner similar to LFSR 100, and generates a similar sequence of operational states. However, LFSR 200 differs from LFSR 100 in that it utilizes AND gate 220 to enter and exit an additional 1,1,1,1 operation state (LFSR 100 does not enter this state). This additional operational state increases the number of operational states in the cycle associated with LFSR 200 to sixteen. The sequence of sixteen operational states in this cycle is shown in Table 2 (below). A comparison of the sequence in Table 2 with that of Table 1 shows that the sequence of Table 2 inserts the additional 1,1,1,1 state as state 4. All subsequent operational states of the sequence are shifted by one position.

TABLE 2

| STATE | Q3 | Q2 | Q1 | Q0 | STATE | Q3 | Q2 | Q1 | Q0 |
|---|---|---|---|---|---|---|---|---|---|
| 0 | 0 | 0 | 0 | 0 | 8  | 0 | 1 | 1 | 0 |
| 1 | 0 | 0 | 0 | 1 | 9  | 1 | 1 | 0 | 0 |
| 2 | 0 | 0 | 1 | 1 | 10 | 1 | 0 | 0 | 1 |
| 3 | 0 | 1 | 1 | 1 | 11 | 0 | 0 | 1 | 0 |
| 4 | 1 | 1 | 1 | 1 | 12 | 0 | 1 | 0 | 1 |
| 5 | 1 | 1 | 1 | 0 | 13 | 1 | 0 | 1 | 0 |
| 6 | 1 | 1 | 0 | 1 | 14 | 0 | 1 | 0 | 0 |
| 7 | 1 | 0 | 1 | 1 | 15 | 1 | 0 |   |   |

An LFSR can be made to count in the opposite direction ("down") by advancing the taps by one flip-flop, and by wiring the flip-flops in an opposite order to that shown in FIGS. 1 and 2. Examples of such "down-counting" LFSRs are shown in FIGS. 3 and 4.

Referring to FIG. 3, LFSR 300 includes four flip-flops 301 through 304 and an XNOR gate 310 that are wired as a shift-left shift register. The Q3 output terminal of flip-flop 304 is connected to the D2 input terminal of flip-flop 303, the Q2 output terminal of flip-flop 303 is connected to the D1 input terminal of flip-flop 302, and the Q1 output terminal of flip-flop 302 is connected to the D0 input terminal of flip-flop 301. The output terminals Q0 and Q3 of flip-flops 301 and 304 are connected to the input terminals of XNOR gate 310. The output signal from XNOR gate 310 is transmitted to the D3 input terminal of LSB flip-flop 304.

During operation, LFSR 300 cycles through 15 (fifteen) operational states in a sequence that is opposite to that of LFSR 100 (discussed above). For example, if a first operational state is defined when all flip-flops 301 through 304 are reset, a subsequent clock pulse causes LFSR 300 to shift the zero values from flip-flops 302 through 304 into flip-flops 301 through 303, respectively. In addition, the zero values in flip-flops 301 and 304 are combined in XNOR gate 310 to generate a binary one output signal that is transmitted to flip-flop 304. Therefore, LFSR shifts from the reset operational state to a 0,0,0,1 state, which is opposite to that associated with the sequence of LFSR 100. The remaining operational states of LFSR 300 are also opposite to that those shown in Table 1 (above).

FIG. 4 shows a left-shifting four-bit LFSR 400 that has sixteen operational states. LFSR 400 includes flip-flops 401 through 404, a three-input XNOR gate 410 and a three input AND gate 420. Similar to LFSR 300 (see FIG. 3), the Q3 output terminal of flip-flop 404 is connected to the D2 input terminal of flip-flop 403, the Q2 output terminal of flip-flop 403 is connected to the D1 input terminal of flip-flop 402, and the Q1 output terminal of flip-flop 402 is connected to the D0 input terminal of flip-flop 401. The output terminals Q1, Q2 and Q3 of flip-flops 402, 403 and 404 are connected the input terminals of AND gate 420. In addition, the output terminals Q0 and Q3 of flip-flops 401 and 404 are connected to two of the three input terminals of XNOR gate 410, and the output of AND gate 420 is connected to the third input terminal of XNOR gate 410. The output terminal of XNOR gate 410 is connected to the D3 input terminal of flip-flop 404.

LFSR 400 operates in a manner similar to LFSR 300, and generates a similar sequence of operational states. However, LFSR 400 differs from LFSR 300 in that it utilizes AND gate 420 to enter and exit a 1,1,1,1 operation state (LFSR 300 does not enter this state). This additional operational state increases the number of operational states entered by LFSR 400 to sixteen.

An LFSR can also be built to count both up and down by inserting multiplexers in the shift chain and including both the up- and down-counting circuitry as inputs to the least- and most-significant bits in the shift register. FIG. 5 shows an example of a four-bit bi-directional (up/down) LFSR 500 with a maximal counting sequence length (16 states). Referring to FIG. 5, LFSR 500 includes flip-flops 501 through 504, a first three-input XNOR gate 510, a second three-input XNOR gate 511, a first three input AND gate 520, a second three input AND gate 521, and two-input multiplexers 530 through 533. The Q0 output terminal of flip-flop 501 is connected to a first input terminal of multiplexer 531 and to input terminals of XNOR gate 511 and AND gate 520. The Q1 output terminal of flip-flop 502 is connected to a first input terminal of multiplexer 532 and a second input terminal of multiplexer 530. The Q2 output terminal of flip-flop 503 is connected to a first input terminal of multiplexer 533 and a second input terminal of multiplexer 531, and is also connected to input terminals of XNOR gate 510 and AND gates 520 and 521. The Q3 output terminal of flip-flop 504 is connected to the second input terminal of multiplexer 532 and to input terminals of XNOR gates 510 and 511 and AND gate 521. The select input terminals of multiplexers 530 through 533 are controlled by an UP/DOWN signal. When the UP/DOWN signal indicates a count-up mode, signals are passed through the first input terminals of multiplexers 530 through 533 such that LFSR 500 operates in a manner consistent with LFSR 200 (discussed above). In a count-down mode, signals are passed through the second input terminals of multiplexers 530 through 533 such that LFSR 500 operates in a manner consistent with LFSR 400 (discussed above).

LFSRs can also be made to sequence through a number of states whose length is less than $2^n$ or $2^n-1$ (i.e., to reset after a predetermined number of operational states). A conventional sequence control circuit used to omit (skip) operational states in an LFSR is described in "Build Better Sequential Circuits", Hackett and Leach, ASIC & EDA, March 1992. FIG. 6 shows an example of a 4-bit LFSR 600 that incorporates a sequence control circuit such that its sequence includes only 10 states instead of 15 or 16. In particular, LFSR 600 includes flip-flops 601 through 604, a three-input XNOR gate 610, a three input NAND gate 620 (with two inverted input terminals), and a three input AND gate 630. Three-input XNOR gate 610 and three input NAND gate 620 form the sequence control circuit of LFSR 600. The Q0 output terminal of flip-flop 601 is connected to the D1 input terminal of flip-flop 602, and to the first inverted input terminal of AND gate 620. The Q1 output terminal of flip-flop 602 is connected to the D2 input terminal of flip-flop 603, and to the second inverted input terminal of AND gate 620. The Q2 output terminal of flip-flop 603 is connected to the D3 input terminal of flip-flop 604, to the non-inverted input terminal of NAND gate 620, and to a first input terminal of XNOR gate 610. The Q3 output terminal of flip-flop 604 is connected to the second input terminal of XNOR gate 610. The output terminals of XNOR gate 610 and NAND gate 620 are connected to the input terminals of AND gate 630, whose output terminal is connected to the D0 input terminal of flip-flop 601. With this construction, LFSR 600 generates the sequence shown Table 3 (below). This sequence is the same as that shown in Table 1, except that states 9 through 13 of Table 1 are omitted. In particular, AND gate 630 detects state 8 and resets flip-flop 601 to 0 instead of 1, thus skipping states 9 through 13 of Table 1.

TABLE 3

| STATE | Q3 | Q2 | Q1 | Q1 | STATE | Q3 | Q2 | Q1 | Q0 |
|---|---|---|---|---|---|---|---|---|---|
| 0 | 0 | 0 | 0 | 0 | 5 | 1 | 1 | 0 | 1 |
| 1 | 0 | 0 | 0 | 1 | 6 | 1 | 0 | 1 | 1 |
| 2 | 0 | 0 | 1 | 1 | 7 | 0 | 1 | 1 | 0 |
| 3 | 0 | 1 | 1 | 1 | 8 | 1 | 1 | 0 | 0 |
| 4 | 1 | 1 | 1 | 0 | 9 | 1 | 0 | 0 | 0 |

A problem associated with conventional shift registers is that it is possible for third parties to utilize reverse engineering to copy an LFSR design and/or to decipher the encryption scheme defined by the LFSR. Specifically, by utilizing well-known reverse engineering techniques to identify the connections between the flip-flops, the number and location of the taps, and the types of logic gates associated with an LFSR, it is possible for a third party to reconstruct the LFSR. With this knowledge, it is possible for the third party to identify the encryption scheme utilized in the LFSR.

What is needed is a programmable shift register that cannot be reverse engineered to identify the underlying encryption scheme used with the LFSR.

SUMMARY OF THE INVENTION

The present invention is directed to a programmable shift register in which the length (e.g., number of bits), number and location of taps, operating mode (i.e., counting up/down) and number of skip states are configured by programming selected memory cells. The programmable shift register may be configured to implement a linear feedback shift register (LFSR) for encryption purposes. When non-volatile memory cells are used to configure the programmable shift register, it is essentially impossible for a third party to reverse engineer the LFSR to decipher the encryption scheme because the configuration data is erased when power is removed from the programmable shift register.

In accordance with a first aspect of the present invention, a programmable shift register includes a plurality of flip-flops, a programmable interconnect circuit and a mode control circuit. The output terminal of each flip-flop drives a different first (horizontal) line of a bus in the programmable interconnect circuit. Each first line of the bus is programmably connected to a plurality of second (vertical) lines via programmable interconnect points (PIPs). At least two of the second lines are connected to the input terminal of each flip-flop via portions (e.g., multiplexers) of the mode control circuit. Programming the PIPs to link selected flip-flop input and output terminals forms one or more shift registers of a selected length. The mode control circuit can be used to load an initial operating state, or to implement bi-directional (count up/down) control.

In accordance with a second aspect of the present invention, a programmable linear feedback shift register includes a plurality of flip-flops, a programmable interconnect circuit and a next-state control circuit. The output terminal of each flip-flop is transmitted on a first (vertical) line to drive a second (horizontal) line of a first bus in the programmable interconnect circuit. Each second line of the first bus is programmably connected to at least one of a plurality of third (vertical) lines and a plurality of fourth (vertical) lines via programmable interconnect points (PIPs). The second lines of the programmable interconnect circuit are connected to the next-state control circuit. The next-state control circuit includes a sequence circuit, a maximal count circuit and a skip-state circuit, all of which are programmable to utilize the output signals from the flip-flops that are transmitted on the first bus. Output signals from the next-state control circuit are transmitted on fourth (vertical) lines to fifth (horizontal) lines associated with a second bus of the programmable interconnect circuit. The fifth lines of the second bus are programmably connected to the plurality of third lines via PIPs, and at least two of the third lines are connected to the input terminal of each flip-flop. Programming the PIPs to link selected flip-flop input and output terminals can form one or more linear feedback shift registers of a selected length. In addition, the sequence control circuit is programmable to calculate, for example, the XNOR of selected bits (taps) in the shift register, where the XNOR can be introduced into any of the taps of the shift register. Further, the maximal count circuit of the next-state control circuit is programmable to generate an all-ones operational state. Further, the skip-state circuit of the next-state control circuit is programmable to compute skip states in the sequence.

BRIEF DESCRIPTION OF THE DRAWINGS

FIGS. 16A and 16B are schematic diagrams showing the programmable shift register of FIG. 7 configured to implement the linear feedback shift register with skip-state control shown in FIG. 6.

FIG. 17 is a schematic diagram showing a programmable shift register in accordance with a second embodiment of the present invention.

DETAILED DESCRIPTION OF THE DRAWINGS

The present invention is directed to a programmable shift register that overcomes the limitations of the prior art by utilizing a programmable interconnect circuit to link selected stages (flip-flops) to form a circular shift register or a linear feedback shift register.

In the following description, the term "programmably connected" is used to describe a connection between two elements through one or more programmable interconnect points (PIPs). As described in further detail below, in one embodiment a PIP is implemented by a pass transistor whose terminals are respectively connected to the two elements, and whose control terminal is controlled by a volatile or non-volatile memory cell, such as an SRAM or EEPROM cell. When the PIP is programmed in a first state, the pass transistor is turned on to allow signal transmissions from one element to the other, and when the PIP is programmed in a second state, the pass transistor is turned off to prevent signal transmissions. In another embodiment, each PIP may be implemented using linking element, such as a fuse or antifuse element, although this type of structure is less desirable because the programmed state of each linking element can be determined by reverse engineering. However, as used herein, the term "programmably connected" is intended to cover any of these PIP structures.

Similarly, as used herein, the terms "selectively enabled" and "enabled selectively" refer to a circuit structure that is enabled or disabled based on the programmed state of one or more memory cells. As described in further detail below, in one embodiment a logic gate is utilized as a programmable buffer by controlling a first input terminal of the logic gate using a memory cell. When the memory cell is in a first state, the logic gate generates output signals based on data signals received on a second input terminal, and when the memory cell is in a second state, the logic gate generates a constant output (i.e., the logic gate ignores data signals received on the second input terminal). The memory cell may be volatile or non-volatile (e.g., an SRAM or EEPROM cell). In an alternative embodiment, a multiplexer controlled by one or more memory cells (depending upon the number of input terminals) transmits a selected signal based on the programmed state of the memory cell(s). The multiplexer input terminals may respectively receive, for example, a logic gate output signal, the logic gate output signal after inversion, a logic "1" and a logic "0". Alternatively, the multiplexer may receive only the logic gate output signal and a memory cell output signal. A selected one of these signals is passed to the multiplexer output signal in response to the programmed state(s) of the memory cell(s) driving the multiplexer select terminal. The term "selectively enabled" is intended to describe these memory cell-driven logic gates, multiplexers, and equivalent structures, such as linking elements.

Figure 7:
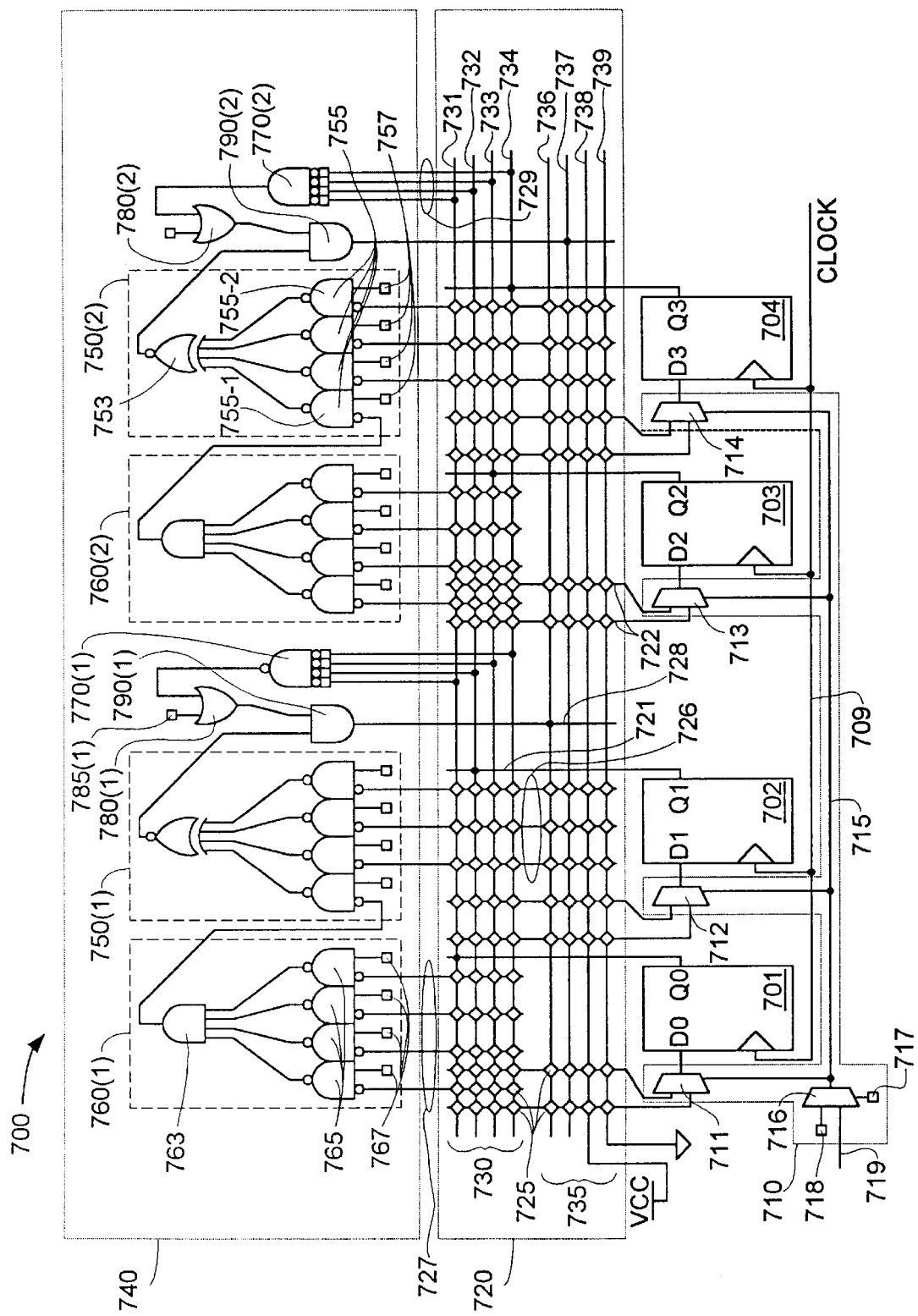
FIG. 7 is a schematic diagram showing a programmable shift register in accordance with a first embodiment of the present invention.

FIG. 7 is a simplified schematic diagram showing a programmable shift register (PSR) 700 in accordance with a first embodiment of the present invention. PSR 700 may be formed as a discrete device, or incorporated with other circuitry in an application specific integrated circuit (ASIC), a programmable logic device (PLD), or any other integrated circuit such as a communications device.

PSR 700 includes flip-flops 701 through 704, a mode control circuit 710, a programmable interconnect circuit 720 and a next-state control circuit 740. PSR 700 is depicted with only four flip-flops for illustrative purposes. Many practical embodiments of the present invention include 128 or more flip-flops. Similarly, practical embodiments require additional programmable interconnect circuit resources (e.g., horizontal lines, vertical lines and programmable interconnect points) to support the additional flip-flops. Other modifications to the programmable interconnect circuit are discussed below with respect to FIG. 17. Further, in some embodiments, mode control circuit 710 and next-state control circuit 740 may be omitted, or may include circuitry that performs the same or similar functions to those described below.

Referring to FIG. 7, flip-flops 701 through 704 have respective input terminals D0 through D3, respective output terminals Q0 through Q3, and clock input terminals (>). When PSR 700 is configured to implement one or more shift registers, data stored in a first one of flip-flops 701 through 704 is transmitted from its output terminal and routed by programmable interconnect circuit 720 and mode control circuit 710 (if present) to the data input terminal of a second one of flip-flops 701 through 704. As discussed in the examples provided below, similar connections are provided for the other flip-flops of PSR 700. Flip-flops 701 through 704 are driven by one or more clock signals (only one CLOCK signal is shown as transmitted on line 709, but more could be added by using the bus connection techniques described herein).

Mode control circuit 710 is provided to control the data shift direction (right or left) or the operating mode (e.g., initialize or normal operation) of PSR 700. Mode control circuit 710 includes multiplexers 711 through 714 whose input terminals receive signals from programmable interconnect circuit 720, and whose output terminals are connected to data input terminals D0 through D3 of flip-flops 701 through 704, respectively. In accordance with one configuration, the top input terminal of each multiplexer 711 through 714 is used to transmit initial data signals, and the bottom input terminal is used to transmit shifted data signals during operation. In accordance with another configuration, the top input terminal of each multiplexer 711 through 714 is used to transmit right-shift data signals, and the bottom input terminal is used to transmit left-shift data signals to the respective flip-flops. The select input terminals of multiplexers 711 through 714 are controlled by a mode control signal transmitted on line 715. Line 715 is connected to the output terminal of another multiplexer 716. Multiplexer 716 is controlled by a memory cell 717 to transmit either a fixed signal stored in memory cell 718, or a variable signal transmitted on line 719 from signal generation circuitry (not shown). This signal generation circuitry can either be located on the same integrated circuit as PSR 700, or located on a separate integrated circuit.

Programmable interconnect circuit 720 includes a multiplicity of programmable interchange points (PIPs) 725 that programmably connect groups of vertical input/output (I/O) lines with the horizontal bus lines of a first bus 730 and a second bus 735. The terms "horizontal" and "vertical" are used herein for explanatory purposes only, and are not intended to limit the appended claims.

The vertical I/O lines of programmable interconnect circuit 720 include first I/O lines 721 and second I/O lines 722 that transmit data signals to and from flip-flops 701 through 704. Each first I/O line 721 is connected between one flip-flop output terminal and one bus line of first bus 730. For example, Q1 output terminal of flip-flop 702 is connected via a first I/O line to bus line 732. Each second I/O line 722 is programmably connected (via PIPs 725 ) to each bus line in first bus 730 and second bus 735, and is connected to one of the input terminals of multiplexers 711 through 714. In addition, third I/O lines 726, fourth I/O lines 727, fifth I/O lines 728 and sixth I/O lines 729 are used to transmit data signals to and from next-state control circuit 740. Third I/O lines 726 are programmably connected to each bus line in first bus 730 and second bus 735. Fourth I/O lines 727 are programmably connected to each line in first bus 730. Each of the fifth I/O lines 728 is connected to one of bus lines 736 and 737 in second bus 735. Each of the sixth I/O lines 729 is connected to one of the bus lines in first bus 730. The third, fourth, fifth and sixth I/O lines are discussed in further detail below.

As indicated in FIG. 7, first bus 730 includes horizontal bus lines 731 through 734. In accordance with the first embodiment, each bus line 731 through 734 of first bus 730 has a fixed (hard-wired) connection to one data output terminal of an associated flip-flop 711 through 714 via one of the first I/O lines 721. In this manner, horizontal line 731 is driven by the Q0 output terminal, horizontal line 732 is driven by Q1 output terminal, horizontal line 733 is driven by Q2 output terminal, and horizontal line 734 is driven by Q3 output terminal. The signals driven onto horizontal lines 731 through 734 are transmitted to the input terminals of multiplexers 711 through 714 and/or to next-state control circuit 740 via PIPs 725.

Also, in accordance with the first embodiment, second bus 735 includes horizontal lines 736 through 739. Horizontal lines 736 and 737 are driven by output signals on fifth I/O lines 728 transmitted from next-state circuit 740, as discussed below. In the present embodiment, horizontal lines 738 and 739 are respectively maintained at Vcc (e.g., 5 volts) and ground (e.g., zero volts). In other embodiments, these lines may receive signals from external signal sources (not shown). The signals transmitted on second bus 735 are routable to mode control circuit 710 via PIPs 725.

Figure 8A:
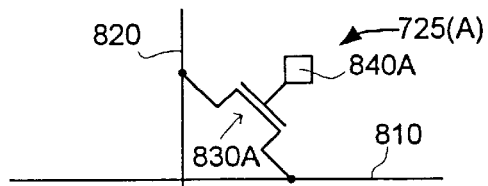
FIGS. 8A, 8B and 8C are diagrams showing first, second and third programmable interconnect point (PIP) circuits.
Figure 8B:
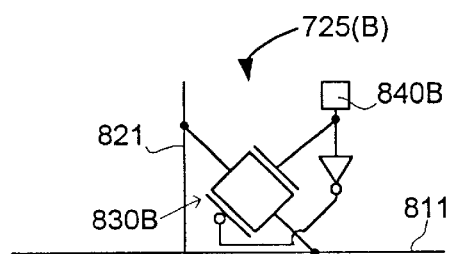
Figure 8C:
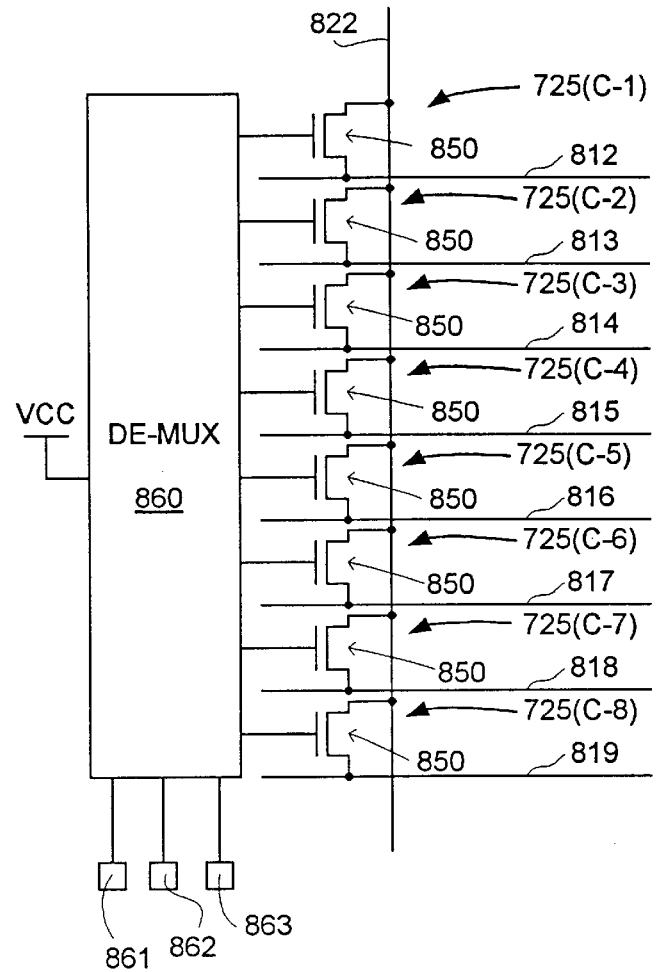

FIGS. 8A, 8B and 8C are simplified circuit diagrams showing examples of circuits implementing PIPs 725 in accordance with the present invention. As mentioned above, each PIP 725 provides a programmable connection between a horizontal bus line and a vertical I/O line connected to either mode control circuit 710 or next-state control circuit 740.

FIG. 8A shows a PIP 725 (A) in accordance with a first embodiment. PIP 725 (A) programmably connects a horizontal line 810 and a vertical line 820. PIP 725 (A) includes an NMOS pass gate 830 A that is controlled by a discrete memory cell 840 A. Memory cell 840 A can be either volatile (e.g., an SRAM) or non-volatile (e.g., an EEPROM). When set to logic "1" (high), memory cell 840A turns on pass gate 830A, thereby allowing signals to pass from horizontal line 810 to vertical line 820. Conversely, when memory cell 840A is set to logic "0" (low), pass gate 830 is turned off, thereby preventing signals from passing from horizontal line 810 to vertical line 820.

FIG. 8B shows a PIP 725(B) in accordance with a second embodiment. PIP 725(B) programmably connects a horizontal line 811 and a vertical line 821. PIP 725(B) includes a CMOS pass gate 830B that is controlled by a discrete memory cell 840B. When set to logic "1" (high), memory cell 840B generates a high output signal that turns on CMOS pass gate 830B, thereby allowing signals to pass from horizontal line 811 to vertical line 821. Conversely, when memory cell 840B is set to logic "0" (low), pass gate 830B is turned off, thereby preventing signals from passing from horizontal line 811 to vertical line 821.

FIG. 8C shows a third embodiment in which eight associated PIPs 725(C-1) through 725(C-8) are connected to a vertical line 822. PIPs 725(C-1) through 725(C-8) are respectively connected between horizontal lines 812 through 819 and vertical line 822. Because only one horizontal line 812 through 819 can be connected to vertical line 822, it may be desirable to control PIPs 725(C-1) through 725(C-8) from an encoded representation stored in a minimal number of memory cells. In this example, each PIP 725(C-1) through 725(C-8) includes an NMOS pass transistor 850 that is controlled by a de-multiplexer (DE-MUX) 860 whose select input terminals are controlled by three memory cells 861 through 863. de-multiplexer 860 transmits a high signal to only one of PIPs 725(C-1) through 725(C-8) in accordance with the encoded representation stored in memory cells 861 through 863, thereby turning on only one pass transistor 850 and connecting one horizontal line to vertical line 822. This circuit reduces the number of memory cells required to control PIPs 725(C-1) through 725(C-8). Memory cells 861 through 863 can be either volatile (e.g., an SRAM) or non-volatile (e.g., an EEPROM). The specific embodiments shown in FIGS. 8A, 8B and 8C are intended to be exemplary and not limiting. Other circuits or structures may be used to form PIPs 725, such as PMOS pass gates, fuse elements or antifuse elements.

Referring again to FIG. 7, next-state control circuit 740 includes logic circuits utilized to generate bits transmitted to a selected flip-flop when PSR 700 is used as a linear feedback shift register (LFSR). In the embodiment shown in FIG. 7, next-state control circuit 740 can be separated into two groups, each group including identical subgroup circuitry. Specifically, each group includes a sequence circuit 750, a maximal count circuit 760, a skip-state circuit 770, an OR gate 780 and an AND gate 790. The reference numerals of subgroup circuitry associated with the first group are designated with a "(1)" suffix, and those associated with the second group are designated with a "(2)" suffix. As will be described in the examples provided below, these discrete groups are selectively enabled such that PSR 700 emulates any of the conventional linear feedback shift registers shown in FIGS. 1 through 6.

Both sequence circuits 750(1) and 750(2) have identical components. Referring to sequence circuit 750(2), these components include a primary logic gate 753, a series of secondary logic gates 755, and memory cells 757 for selectively enabling secondary logic gates 755. Primary logic gate 753 has an output terminal connected to an input terminal of AND gate 790(2), and input terminals connected to output terminals of secondary logic gates 755. In the present embodiment, primary logic gate 753 is an XNOR gate. In other embodiments, primary logic gate 753 may be implemented by other logic gates, such as XOR, NOR, AND or NAND logic gates, or a combination of logic gates. The purpose of secondary logic gates 755 is to enable selectively the transmission of input signals from programmable interconnect circuit 720 or maximal count circuit 760(2) to primary logic gate 753 in accordance with the programmed state of memory cells 757. In the disclosed embodiment, each secondary logic gate 755 is a NAND gate having a first input terminal for receiving data signals (via an inverter), and a second input terminal driven by one memory cell 757.

In other embodiments, secondary logic gates 755 may be implemented by other logic gates, such as AND, OR and NOR gates. The data signals transmitted to the first input terminals of secondary logic gates 755 are either transmitted from programmable interconnect circuit 720 on third I/O lines 726, or from maximal count circuit 760. Specifically, referring to sequence circuit 750(2), the first input terminal of secondary logic gate 755-1 receives a signal generated by maximal count circuit 760(2). The first input terminals of the remaining secondary logic gates, such as secondary logic gate 755-2, either receive data signals generated by flip-flops 701 through 704 and transmitted via bus 730 of programmable interconnect circuit 720, or receive data signals transmitted on lines 736 through 739 on bus 735. When a memory cell 757 is set to a logic "1" value (high), the secondary logic gate 755 controlled by that memory cell is enabled to drive an associated input terminal of primary logic gate 753 in accordance with the data signals received on its first input terminal. When a memory cell 757 is set to a logic "0" value (low), the secondary logic gate 755 is disabled such that it ignores the data signal received on its first input terminal.

Both maximal count circuits 760(1) and 760(2) have identical components. Referring to maximal count circuit 760(1), these components include a primary logic gate 763, a series of secondary logic gates 765, and memory cells 767 for selectively enabling secondary logic gates 765. When utilized by sequence control circuits 750, maximal count circuits 760 calculate a maximal sequence count value by, for example, computing the logical AND of a subset of the flip-flops. Each primary logic gate 763 has an output terminal connected to the input terminal of one of the sequence control circuits 750, and input terminals connected to output terminals of secondary logic gates 765. In the present embodiment, primary logic gate 763 is an AND gate. In other embodiments, primary logic gate 763 may be implemented by other logic gates, such as OR, XOR, NOR or NAND logic gates, or a combination of logic gates. Similar to sequence control circuits 750, each secondary logic gate 765 of maximal count circuits 760 is a NAND gate having a first input terminal for receiving data signals (via an inverter) from bus lines 727 of first bus 730 and second bus 735 of programmable interconnect circuit 720, and a second input terminal driven by a memory cell 767. Memory cells 767 selectively enable the secondary logic gates 765 to drive an associated input terminal of primary logic gate 763 in accordance with the data signals received on its first input terminal.

Skip-state circuits 770, OR gates 780 and AND gates 790 are provided so that PSR 700 can implement non-maximal length LFSRs. Each skip-state circuit 770 includes input terminals that are respectively connected to bus lines 731 through 734 of first bus 730, and has an output terminal that drives a first input terminal of an OR gate 780 (e.g., OR gate 780(1)). Skip-state circuits 770 are discussed in additional detail below. Each OR gate 780 selectively enabled by a memory cell 785 (e.g., the second input terminal of OR gate 780(1) is connected to memory cell 785(1)). The output terminal of each OR gate 780 is connected to a second input terminal of an AND gate 790 (as mentioned above, the output terminal of a sequence control circuit 750 is connected to the first input terminal of each AND gate 790(1)). The output terminal of each AND gate 790 is connected to one of the bus lines in second bus 735 via I/O lines 728. For example, AND gate 790(1) drives line 736 of second bus 735, and AND gate 790(2) drives line 737. If memory cell 785(1) is set to logic "1" (high), then AND gate 790(1) passes the output signal from sequence control circuit 750(1) to line 736 in second bus 735. If memory cell 785(1) is set to logic "0", then AND gate 790(1) generates an output signal that is determined by the logical AND of the data signal output from sequence control circuit 750(1) and a calculated skip value output signal from skip-state circuit 770(1).

Figure 9:
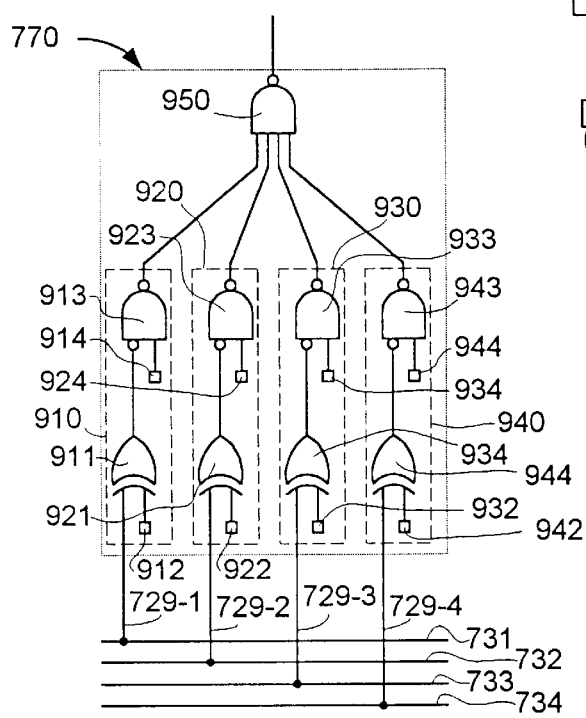
FIG. 9 is a schematic diagram showing a skip-state circuit in accordance with the first embodiment.

Referring also to FIG. 9, in one embodiment, each skip-state circuit 770 includes programmable input terminals 910, 920, 930 and 940 that select from the data signals generated by any of flip-flops 701 through 704 via respective connections to the bus lines 731 through 734 of first bus 730, and transmit these data signals in a non-inverted or inverted form to a NAND gate 950. Each programmable input terminal includes circuitry for selectively passing data signals to NAND gate 950, and circuitry for selectively inverting the data signals. For example, programmable input terminal 910 includes an XOR gate 911, and first memory cell 912, a NAND gate 913 and a second memory cell 914. XOR gate 911 has a first input terminal connected to bus line 731 and a second input terminal connected to memory cell 912. XOR gate 911 selectively inverts a data signal transmitted on bus line 731 in accordance with the programmed state of memory cell 912. When memory cell 912 is set to logic "0" (low), signals on bus line 731 are transmitted in a non-inverted form to NAND gate 913. When memory cell 912 is set to logic "1" (high), signals on bus line 731 are transmitted to NAND gate 913 in an inverted form. In either case, the signals from XOR gate 911 are inverted at the first input terminal of NAND gate 913 (as indicated by the bubble). The second input terminal is connected to memory cell 914. Similar to the memory cells 757 and 767 (discussed above), memory cell 914 selectively enables NAND gate 913 to transmit data signals to NAND gate 950 in accordance with its programmed state. Programmable input terminals 920, 930 and 940 have similar circuitry, and all of these programmable input terminals feed NAND gate 950.

In accordance with the present invention, PSR 700 is configurable to implement circular shift registers and linear feedback shift registers by programming selected memory cells and PIPs. Examples of these implementations are shown in FIGS. 10 through 16, and are described below.

Figure 10:
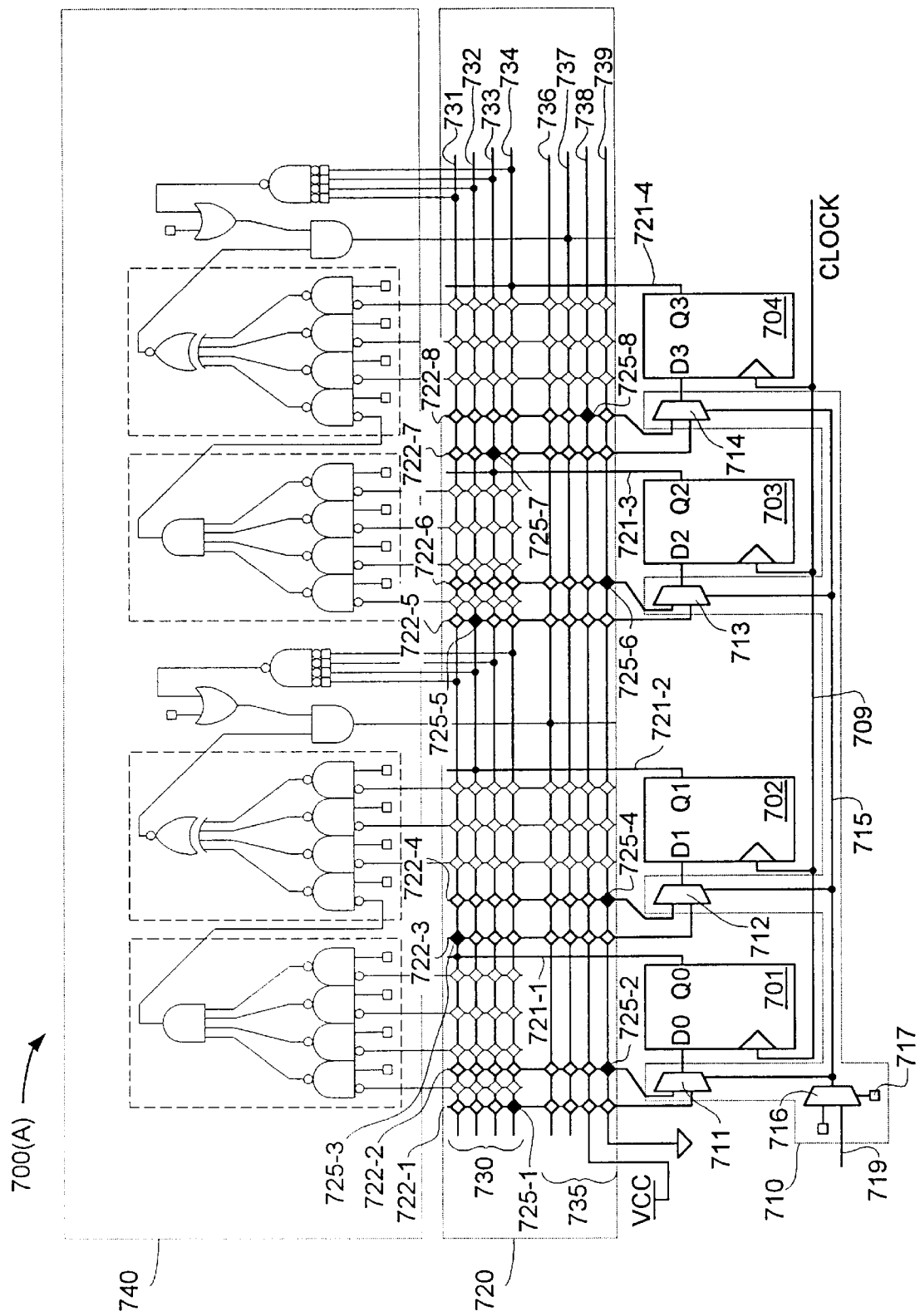
FIG. 10 is a schematic diagram showing the programmable shift register of FIG. 7 configured as a circular shift register.

FIG. 10 shows PSR 700(A) configured to implement a four-bit circular shift register. Programmed memory cells and PIPs are indicated by darkened diamonds/squares. Portions of PSR 700 that are not utilized to implement the circular shift register in this example are indicated with light lines. Specifically, next-state control circuit 740 and the I/O lines and PIPs of programmable interconnect circuit 720 associated with the transmission/reception of signals from next-state control circuit 740 are indicated as not utilized in the circular shift register implemented by PSR 700(A). The example shown in FIG. 10 illustrates that PSR 700 may be beneficially utilized without next-state control circuit 740.

Programmable interconnect circuit 720 of PSR 700(A) is configured to transmit the data from flip-flop 701 to flip-flop 702, from flip-flop 702 to flip-flop 703, from flip-flop 703 to flip-flop 704, and from flip-flop 704 to flip-flop 701. Specifically, data signals transmitted from the Q0 output terminal of flip-flop 701 are transmitted on I/O line 721-1 to bus line 731. PIP 725-3 is set to logic "1" (indicated by a darkened diamond) to connect bus line 731 to I/O line 722-3, which transmits signals through multiplexer 712 to the D1 input terminal of flip-flop 702. Similarly, data signals are transmitted from the Q1 output terminal of flip-flop 702 on I/O line 721-2 to bus line 732, through PIP 725-5 to I/O line 722-5, and through multiplexer 713 to the D2 input terminal of flip-flop 703. Data signals from the Q2 output terminal of flip-flop 703 are transmitted on I/O line 721-3 to bus line 733, through PIP 725-7 to I/O line 722-7, and through multiplexer 714 to the D3 input terminal of flip-flop 704. To complete the circle, data signals from the Q3 output terminal of flip-flop 704 are transmitted on I/O line 721-4 to bus line 734, through PIP 725-1 to I/O line 722-1, and through multiplexer 711 to the D0 input terminal of flip-flop 701.

Mode control circuit 710 of PSR 700(A) is configured to switch between a data entry mode and a normal operation mode. To facilitate this mode change, memory cell 717 is programmed to pass signals from line 719 through multiplexer 716 and along line 715 to the select terminals of multiplexers 711 through 714. In this example, an initial data set of 0,0,0,1 is transmitted to flip-flops 701 through 704 when an initialize command is transmitted on line 719, as explained in detail below. The initial data is transmitted to flip-flops 701 through 704 through the upper input terminal of each multiplexer 711 through 714. Specifically, I/O lines 722-2, 722-4 and 722-6 are programmably connected to bus line 739 (which, in this example, is maintained in a logic "0" state) via PIPs 725-2, 725-4 and 725-6. Similarly, I/O line 722-8 is programmably connected to bus line 738 (which, in this example, is maintained in a logic "1" state) via PIP 725-8. Of course, other methods may be used to transmit initial data signals to flip-flops 701 through 704, such as by transmitting data signals from an external source on bus lines 736 or 737 of second bus 735. Once the initial data is stored in flip-flops 701 through 704, the mode control signal on line 719 changes to shift operation, and subsequent clock signals on line 709 cause the initial data to shift between flip-flops 701 through 704, thereby implementing a circular shift register.

Figure 1:
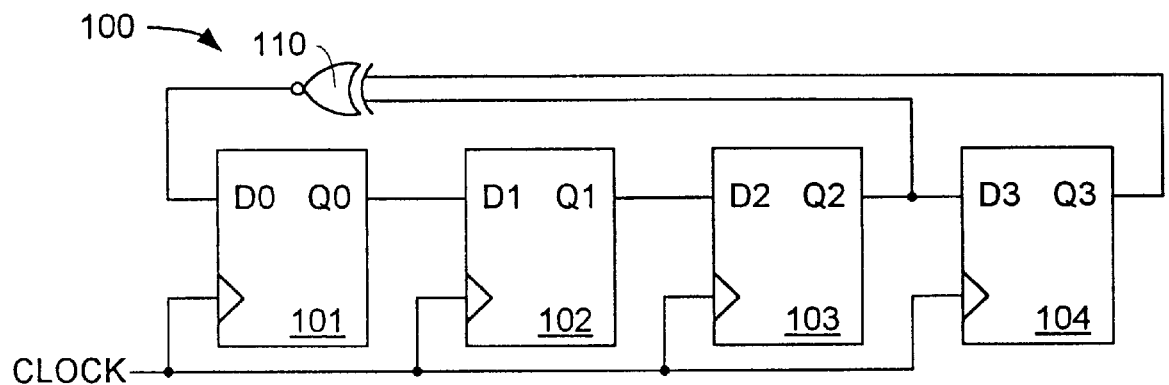
FIG. 1 is a schematic diagram showing a first conventional shift-right linear feedback shift register.
Figure 11:
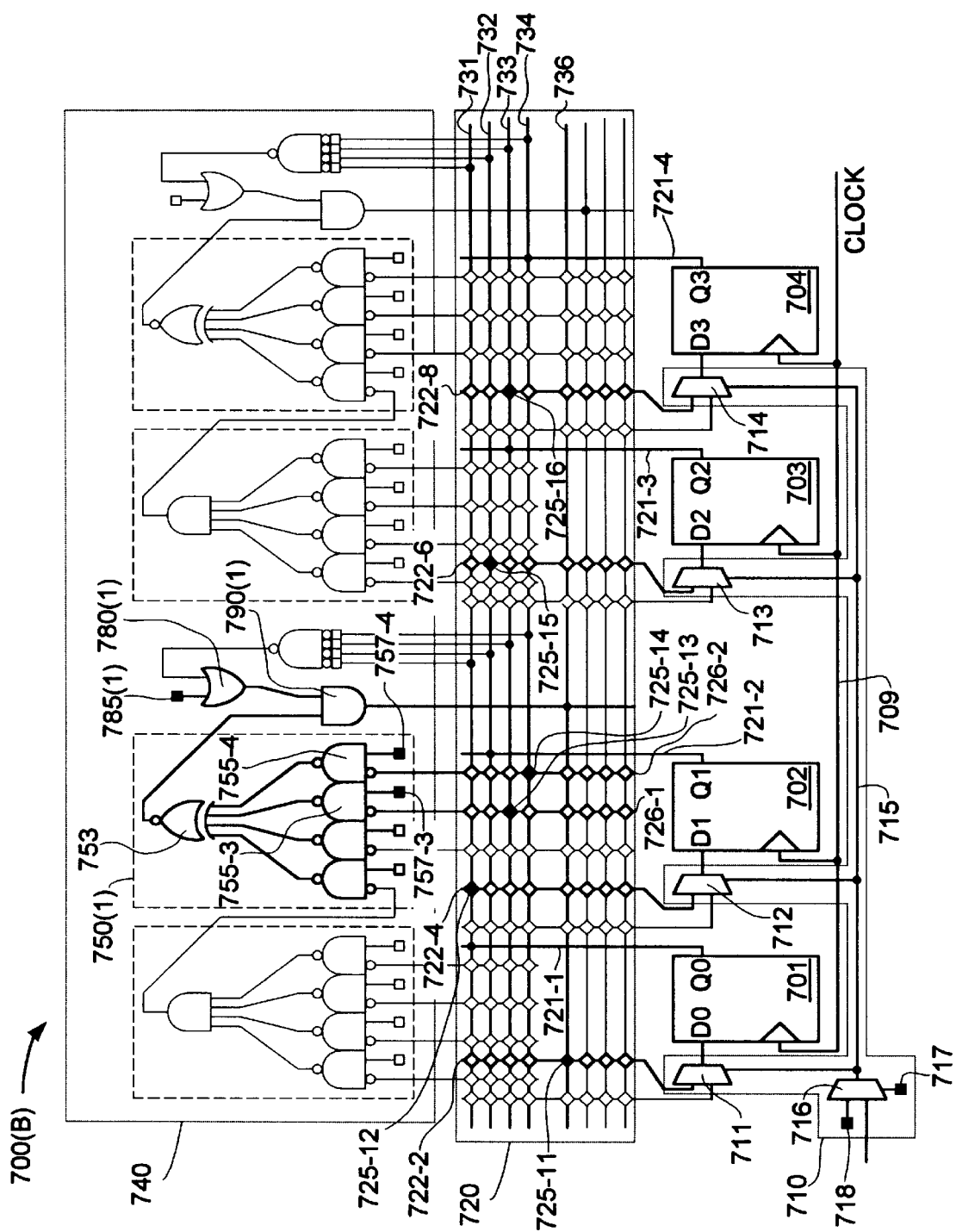
FIG. 11 is a schematic diagram showing the programmable shift register of FIG. 7 configured to implement the first shift-right linear feedback shift register shown in FIG. 1.

FIG. 11 shows a second example in which PSR 700(B) is configured to implement the shift-right linear feedback shift register (LFSR) shown in FIG. 1. In this example, mode control circuit 710 is programmed to transmit a fixed mode signal from memory cell 718 to select the top data input terminals of multiplexers 711 through 714. Because the mode signal is fixed, this example illustrates that PSR 700 may be beneficially constructed without mode control circuit 710 (i.e., with connections directly between I/O lines 722 and flip-flops 701 through 704). In addition, programmable interconnect circuit 720 of PSR 700(B) is configured to shift data from flip-flop 701 to flip-flop 702, from flip-flop 702 to flip-flop 703, and from flip-flop 703 to flip-flop 704. To facilitate this data shift, data signals transmitted from the Q 0 output terminal of flip-flop 701 are transmitted on I/O line 721-1 to bus line 731. PIP 725-12 is set to logic "1" (indicated by a darkened diamond) to connect bus line 731 to I/O line 722-4, which transmits signals through multiplexer 712 to the D1 input terminal of flip-flop 702. Similarly, data signals are transmitted from the Q1 output terminal of flip-flop 702 on I/O line 721-2 to bus line 732, through PIP 725-15 to I/O line 722-6, and through multiplexer 713 to the D2 input terminal of flip-flop 703. Data signals from the Q2 output terminal of flip-flop 703 are transmitted on I/O line 721-3 to bus line 733, through PIP 725-16 to I/O line 722-8, and through multiplexer 714 to the D3 input terminal of flip-flop 704.

As indicated in FIG. 11, sequence control circuit 750(1) is utilized to implement the next-state logic that generates the least significant bit data of the LFSR that is transmitted to flip-flop 701. In particular, the output signal from flip-flop 703 is transmitted on bus line 733, through PIP 725-13 to I/O line 726-1, and is applied to the inverted input terminal of secondary logic (NAND) gate 755-3. Similarly, the output signal from flip-flop 704 is transmitted on bus line 734, through PIP 725-14 to I/O line 726-2, and is applied to the inverted input terminal of NAND gate 755-4. NAND gates 755-3 and 755-4 are selectively enabled (via memory cells 757-3 and 757-4) to transmit these signals to primary logic (XNOR) gate 753. The remaining NAND gates of sequence control circuit 750(1) are selectively disabled. The output signal from XNOR 753 is transmitted to a first input terminal of AND gate 790(1). OR gate 780(1) transmits a high signal to a second input terminal of AND gate 790(1) based on the programmed state of memory cell 785(1). Therefore, AND gate 790(1) generates an output signal to bus line 736 that is consistent with the output signal from XNOR gate 753. The output signal on bus line 736 is transferred to I/O line 722-2 via PIP 725-11, and then to flip-flop 701 through multiplexer 711.

With the configuration shown in FIG. 11, PSR 700(B) implements the shift-right LFSR shown in FIG. 1, and generates the same state sequence that is shown in Table 1.

Figure 2:
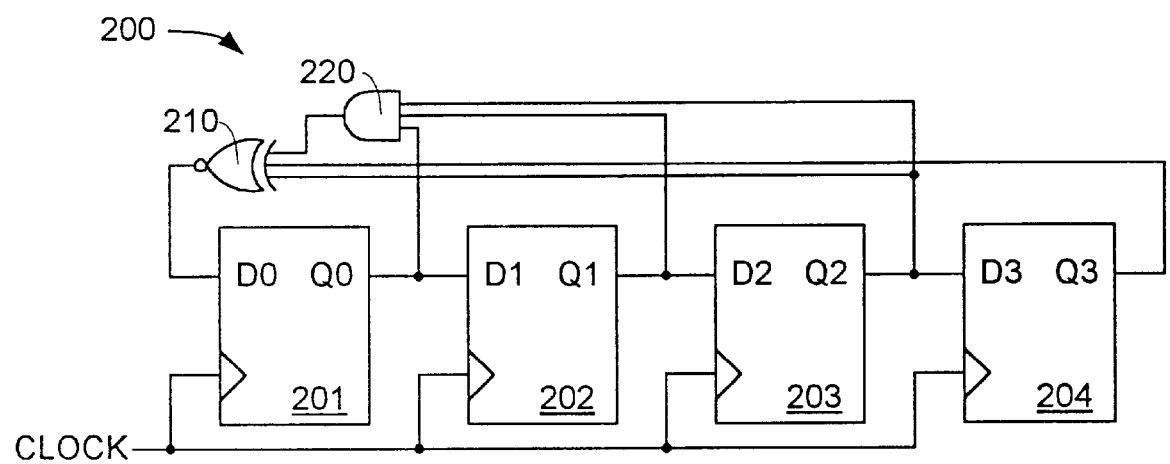
FIG. 2 is a schematic diagram showing a second conventional shift-right linear feedback shift register.
Figure 3:
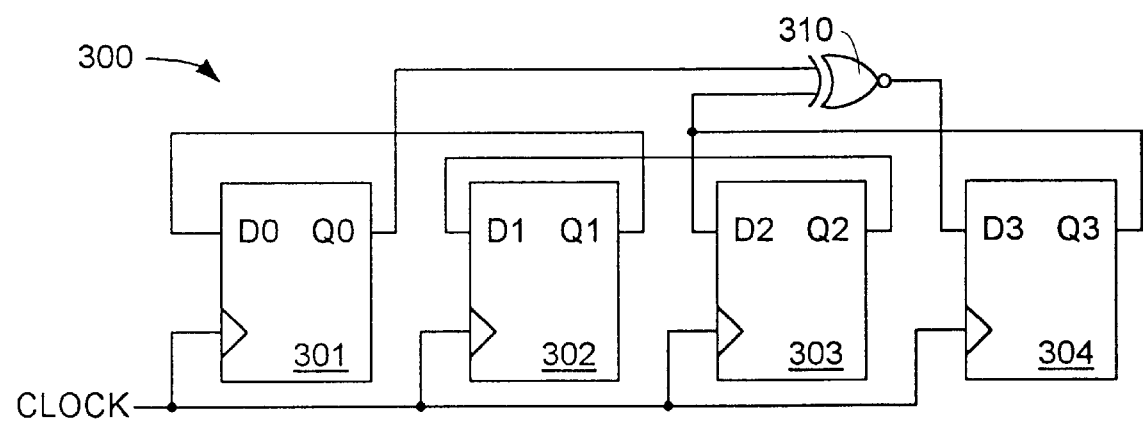
FIG. 3 is a schematic diagram showing a first conventional shift-left linear feedback shift register.
Figure 12:
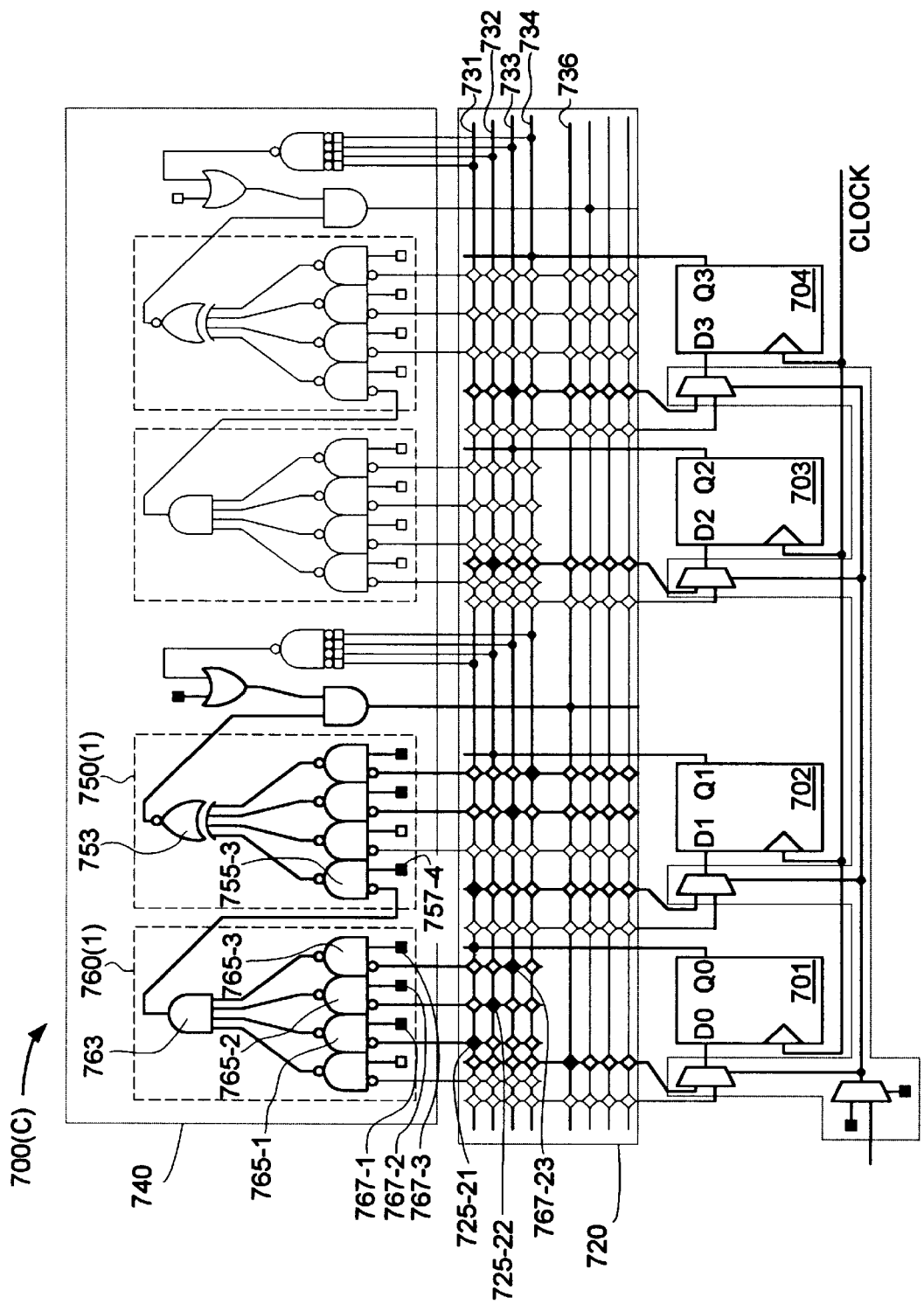
FIG. 12 is a schematic diagram showing the programmable shift register of FIG. 7 configured to implement the second shift-right linear feedback shift register shown in FIG. 2.

FIG. 12 shows a third example in which PSR 700(C) is configured to implement the maximal length shift-right LFSR shown in FIG. 2. PSR 700(C) includes many of the same programmable connections used in PSR 700(B) (discussed above with respect to FIG. 11), and these programmable connections are omitted from the following discussion. For the sake of brevity, only programmable connections that are different from those discussed above will be described.

As indicated in FIG. 12, next-state circuit 740 is modified to implement the maximal count data signal generated by maximal count circuit 760(1). In particular, secondary logic gates 765-1, 765-2 and 765-3 are selectively enabled by memory cells 767-1, 767-2 and 767-3, respectively, and are programmably connected to bus lines 731, 732 and 733, respectively. As mentioned above, bus lines 731, 732 and 733 are respectively driven by flip-flops 701, 702 and 703. The output signals from secondary logic (NAND) gates 765-1, 765-2 and 765-3 are received by primary logic (AND) gate 763, which generates a logic NAND output signal that is transmitted to NAND gate 755-3 of sequence control circuit 750(1). NAND gate 755-3 is selectively enabled by memory cell 757-4 to pass the output signal from maximal count circuit 760(1) to XNOR gate 753.

With the configuration shown in FIG. 12, PSR 700(C) implements the maximal count shift-right LFSR shown in FIG. 2, and generates the same state sequence that is shown in Table 2.

Figure 13:
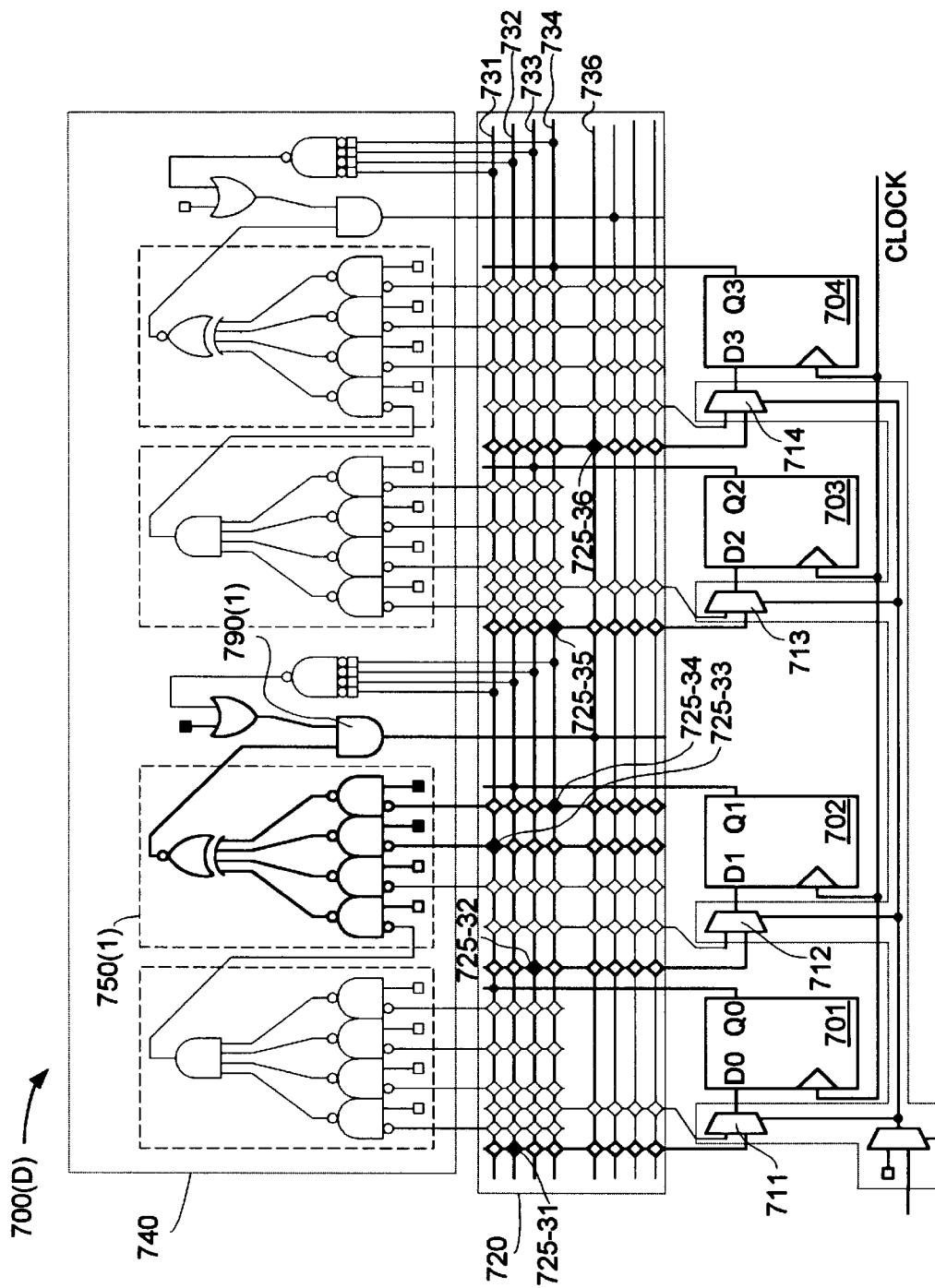
FIG. 13 is a schematic diagram showing the programmable shift register of FIG. 7 configured to implement the first shift-left linear feedback shift register shown in FIG. 3.

FIG. 13 shows a fourth example in which PSR 700(D) is configured to implement the shift-left LFSR shown in FIG. 2. PSR 700(D) is similar to the shift-right LFSR configuration shown in FIG. 11 in that sequence control circuit 750(1) receives two input signals, and generates an output signal that is transmitted to bus line 736. PSR 700(D) differs from the shift-right LFSR configuration shown in FIG. 11 in that different memory cells of programmable interconnect circuit 720 are utilized to provide the necessary connections between flip-flops 701 through 704 and sequence control circuit 750(1). In particular, PIP 725-31 programmably connects the Q1 output terminal of flip-flop 702 (via bus line 732) to the D0 input terminal of flip-flop 701 (through multiplexer 711). PIP 725-32 programmably connects the Q2 output terminal of flip-flop 703 (via bus line 733) to the D1 input terminal of flip-flop 702 (through multiplexer 712). PIPs 725-33 and 725-34 programmably connect the Q0 and Q3 output terminals of flip-flops 701 and 704 (via bus lines 731 and 734) to two of the input terminals of sequence control circuit 750(1). PIP 725-35 programmably connects the Q3 output terminal of flip-flop 704 (via bus line 734) to the D2 input terminal of flip-flop 703 (through multiplexer 713). Finally, PIP 725-36 programmably connects the output signal generated by AND gate 790(1) (via bus line 736) to the D3 input terminal of flip-flop 704 (through multiplexer 714).

The configuration shown in FIG. 13 illustrates that PSR 700 is easily changed from the shift-right LSFR shown in FIG. 11 to a shift-left LFSR (such as that shown in FIG. 2) simply by reprogramming selected memory cells of programmable interconnect circuit 720.

Figure 4:
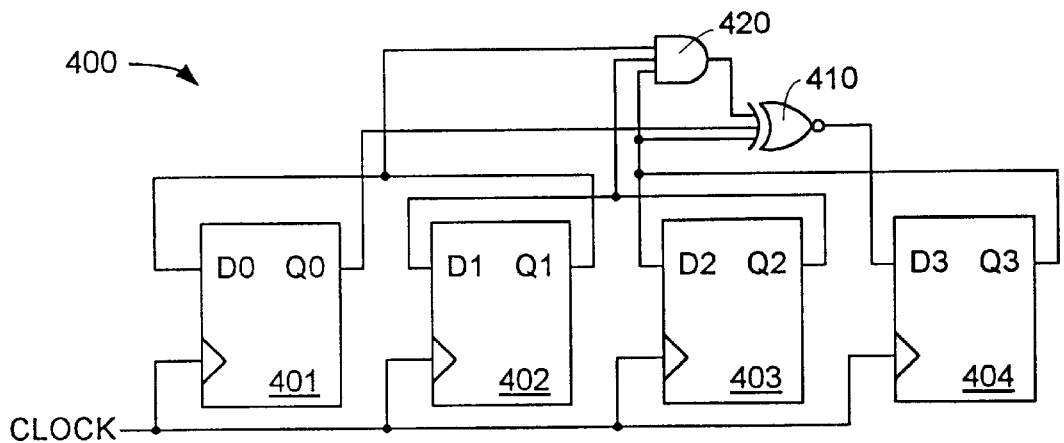
FIG. 4 is a schematic diagram showing a second conventional shift-left linear feedback shift register.
Figure 14:
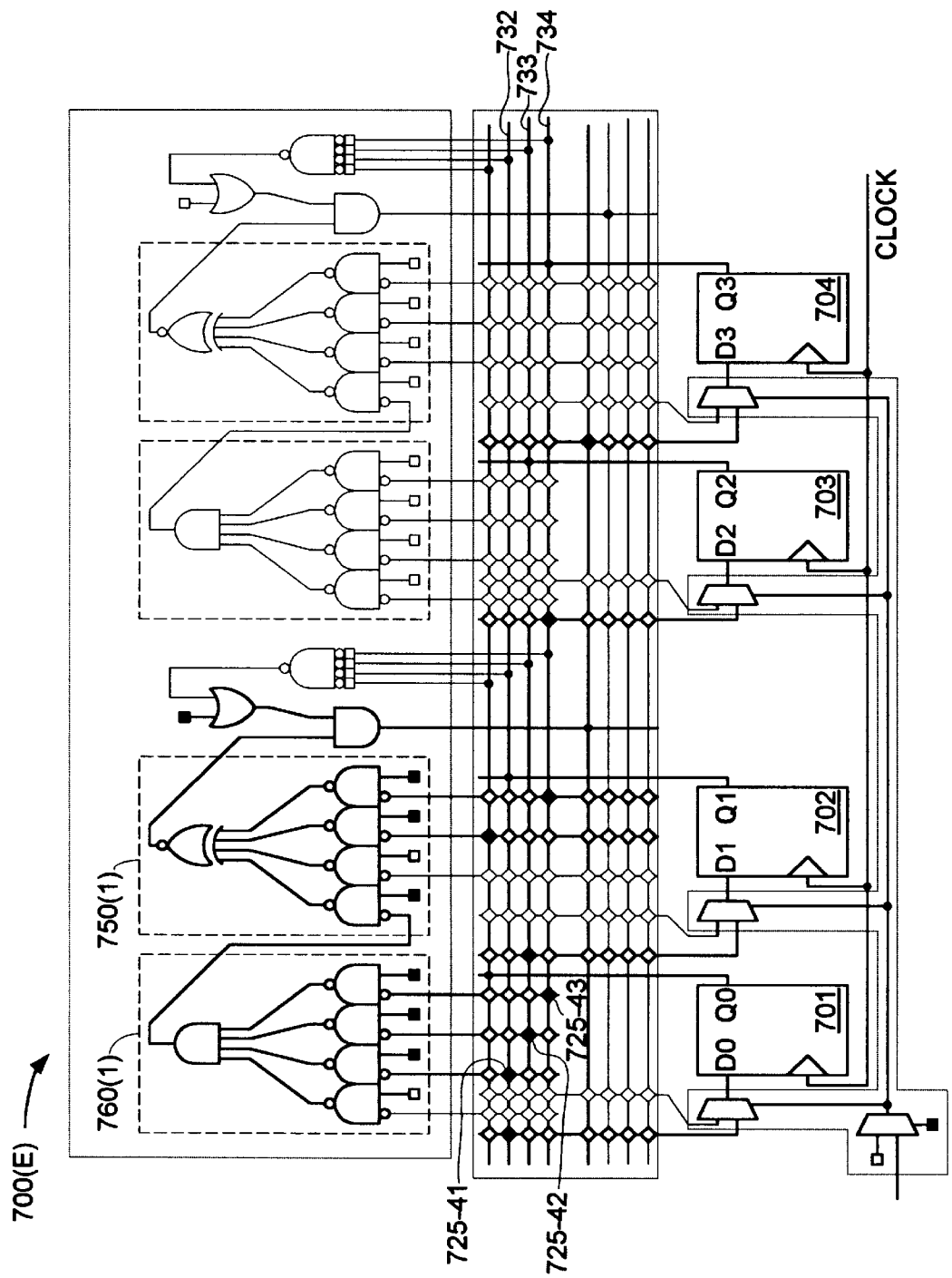
FIG. 14 is a schematic diagram showing the programmable shift register of FIG. 7 configured to implement the second shift-left linear feedback shift register shown in FIG. 4.

FIG. 14 shows a fifth example in which PSR 700(E) is configured to implement the maximal length shift-left LFSR shown in FIG. 4. PSR 700(E) is configured with many of the same programmable connections used in PSR 700(D) (discussed above with respect to FIG. 13), and also includes the configurations of sequence control circuit 750(1) and maximal count circuit 760 (1) that are used in PSR 700(B) (discussed above with respect to FIG. 12). The only difference between PSR 700(E) and these examples is that maximal count circuit 760(1) is programmably connected to the Q1 output terminal of flip-flop 702 (via bus line 732 and PIP 725-41), to the Q2 output terminal of flip-flop 703 (via bus line 733 and PIP 725-42), and to the Q3 output terminal of flip-flop 704 (via bus line 734 and PIP 725-43). With this configuration, PSR 700(E) implements the maximal count shift-left LFSR shown in FIG. 4.

Figure 5:
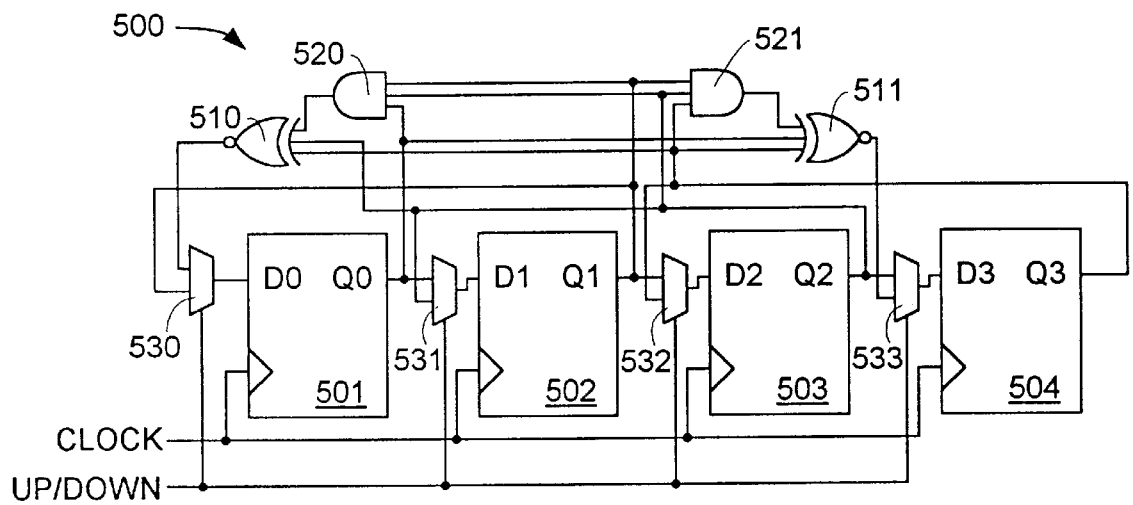
FIG. 5 is a schematic diagram showing a conventional bi-directional linear feedback shift register.
Figure 15:
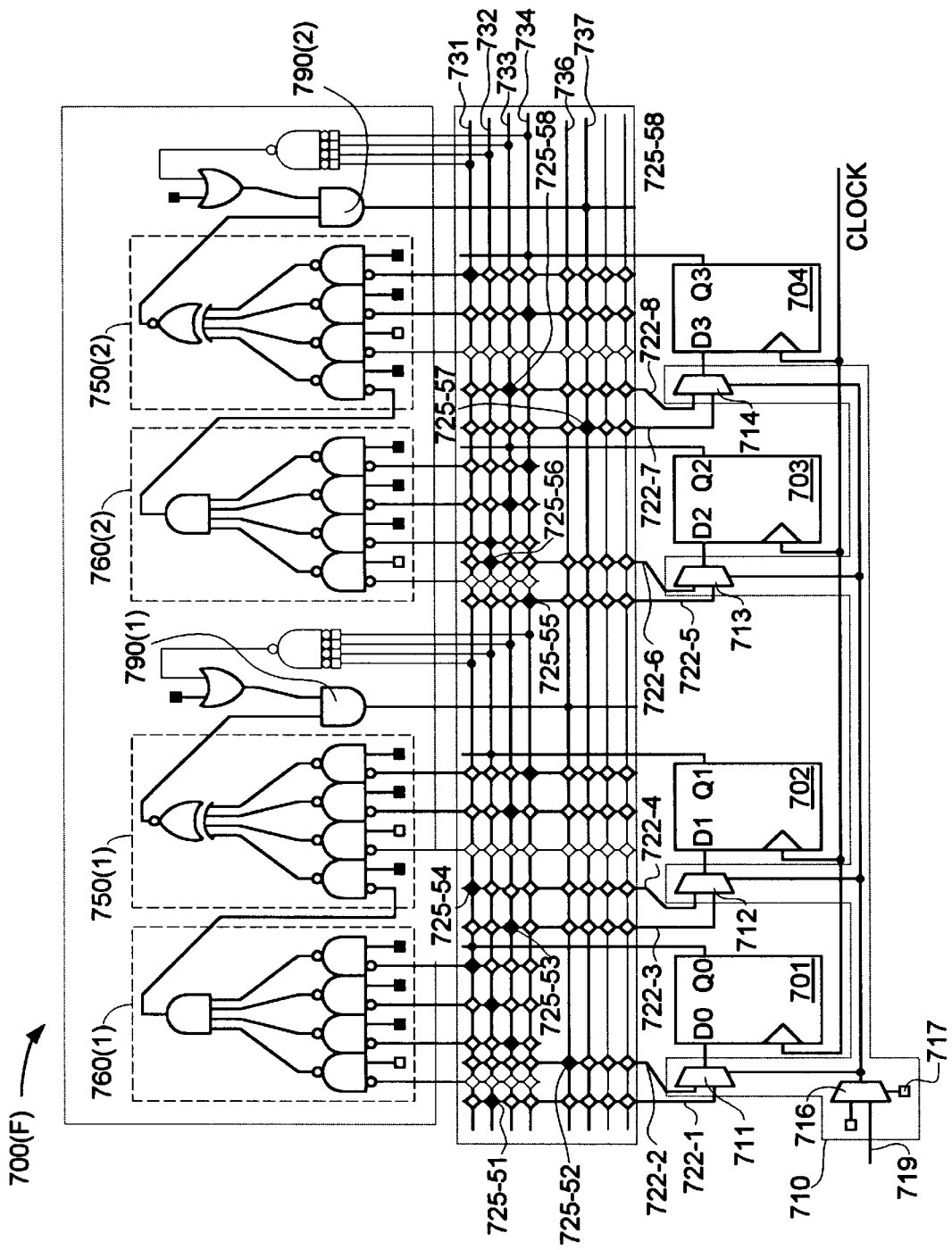
FIG. 15 is a schematic diagram showing the programmable shift register of FIG. 7 configured to implement the bi-directional linear feedback shift register shown in FIG. 5.

FIG. 15 shows a sixth example in which PSR 700(F) is configured to implement the four-bit bi-directional (right/left), maximal length LFSR shown in FIG. 5. This implementation utilizes both circuit groups of next-state control circuit 740 to provide right-shift and left-shift signals. Specifically, the first circuit group including sequence control circuit 750(1), maximal count circuit 760(1), and AND gate 790(1) are configured in a manner consistent with the example shown in FIG. 12 to implement a maximal length right-shift LFSR. In addition, the second circuit group including sequence control circuit 750(2), maximal count circuit 760(2), and AND gate 790(2) are configured in a manner consistent with the example shown in FIG. 14 to implement a maximal length left-shift LFSR.

Mode control circuit 710 is configured to transmit signals selectively to flip-flops 701 through 704 in accordance with either of the shift-right or shift-left configurations. In this example, the upper input terminal of multiplexers 711 through 714 receive signals associated with the shift-right configuration on I/O lines 722-2, 722-4, 722-6 and 722-8, respectively. In particular, I/O line 722-2 is programmably connected to the output terminal of AND gate 790(1) via bus line 736 and PIP 725-52, I/O line 722-4 is programmably connected to the Q0 output terminal of flip-flop 701 via bus line 731 and PIP 725-54, I/O line 722-6 is programmably connected to the Q1 output terminal of flip-flop 702 via bus line 732 and PIP 725-56, and I/O line 722-8 is programmably connected to the Q2 output terminal of flip-flop 703 via bus line 733 and PIP 725-58. Conversely, the lower input terminal of multiplexers 711 through 714 receive signals associated with the shift-left configuration on I/O lines 722-1, 722-3, 722-5 and 722-7, respectively. Specifically, I/O line 722-1 is programmably connected to the Q1 output terminal of flip-flop 702 via bus line 732 and PIP 725-51, I/O line 722-3 is programmably connected to the Q2 output terminal of flip-flop 703 via bus line 733 and PIP 725-53, I/O line 725-5 is programmably connected to the Q3 output terminal of flip-flop 704 via bus line 734 and PIP 725-55, and I/O line 722-7 is programmably connected to the output terminal of AND gate 790(2) via bus line 737 and PIP 725-57. When the mode control signal transmitted on line 719 through multiplexer 716 is in a first logic state, multiplexers 711 through 714 pass the data signals on their respective lower input terminals to flip-flops 701 through 704, thereby causing PSR 700(F) to operate as a shift-left LSFR. Conversely, when the mode control signal transmitted on line 719 is in a second logic state, multiplexers 711 through 714 pass the data signals on their respective upper input terminals to flip-flops 701 through 704, thereby causing PSR 700(F) to operate as a shift-right LSFR.

Figure 6:
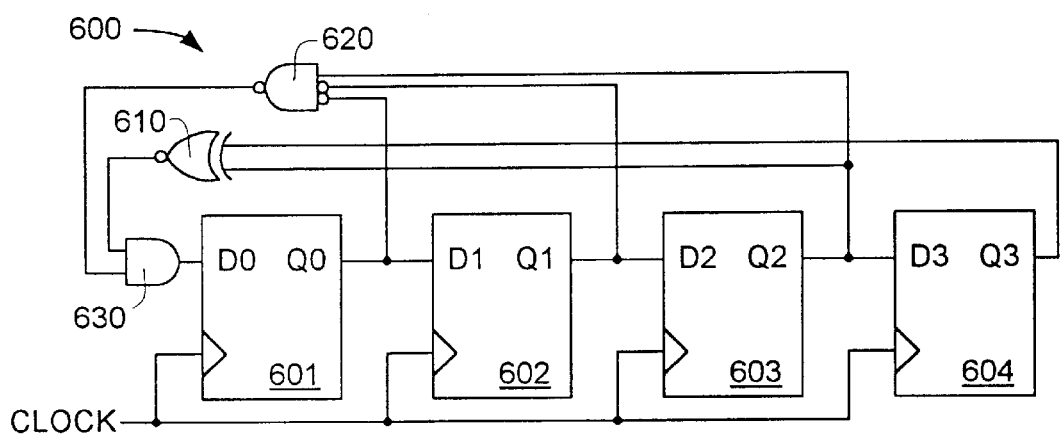
FIG. 6 is a schematic diagram showing a conventional linear feedback shift register with skip-state control.
Figure 16A:
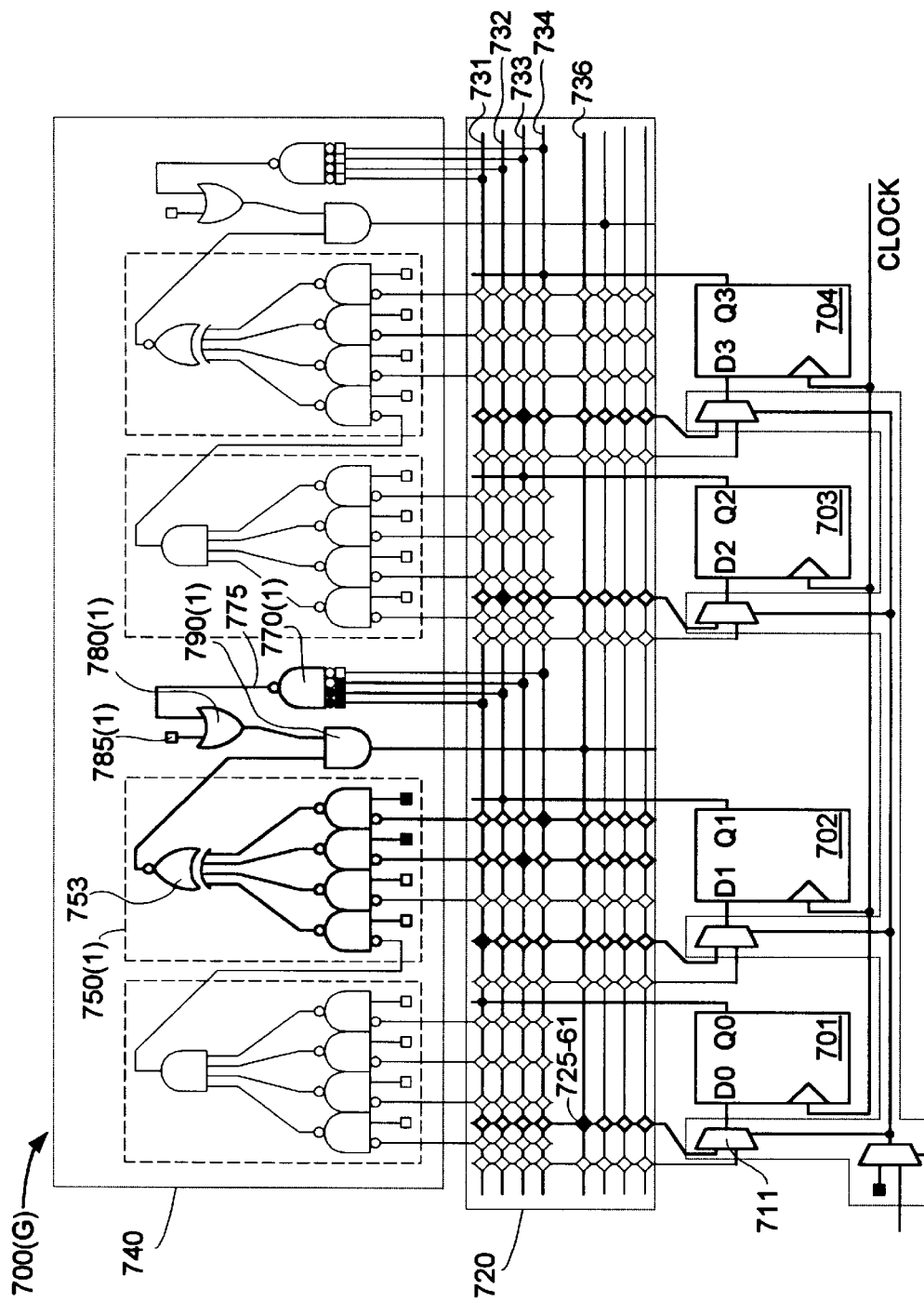

FIGS. 16A and 16B show a seventh example in which PSR 700(G) is configured to implement the LFSR with skip-state control that is shown in FIG. 6. PSR 700(G) is generally configured in a manner consistent with the example shown in FIG. 11, but includes modifications to the configuration of next-state control circuit 740 to utilize skip-state control circuit 770(1).

FIG. 16B shows the configuration of skip-state control circuit 770(1) that facilitate the skip-state logic implemented in the conventional LFSR shown in FIG. 6. First, memory cells 914, 924 and 934 are programmed to enable selectively programmable input terminals 910, 920 and 930 such that they transmit data signals to primary NAND gate 950. Memory cell 944 is set to logic "0", thereby preventing signals on bus line 734 from passing to primary NAND gate 950. In addition, memory cells 912 and 922 are programmed to invert the data signals on bus lines 731 and 732. With this configuration, the signal transmitted on line 775 from primary NAND gate 950 is consistent with that generated by NAND gate 630 of the conventional LFSR shown in FIG. 6.

Referring to FIG. 16A, the output signal from skip-state control circuit 770(1) is transmitted on line 775 to OR gate 780(1). Memory cell 785(1) is programmed to generate a low signal, so the output signal from OR gate 780 (1) is consistent with the signal on line 775. The output signal from OR gate 780(1) is transmitted to AND gate 790(1), where it is logically ANDed with the output signal from XNOR gate 753 of sequence control circuit 750(1). The output signal from AND gate 790(1) is then transmitted via bus line 736, PIP 725-61 and multiplexer 711 to the D0 input terminal of flip-flop 701. With this configuration, PSR 700(G) implements the skip-state shift-right LFSR shown in FIG. 6, and generates the state sequence shown in Table 3 (above).

Although the present invention has been described in considerable detail with reference to the embodiment shown in FIG. 7, other embodiments of the present invention are possible.

For example, FIG. 17 shows PSR 1700 in which programmable interconnect circuit 1720 is modified to include a minimal number of PIPs connecting bus lines 1731 through 1734 of first bus 1730 to sequence control circuit 1750 and maximal count circuit 1760. Specifically, each bus line 1731 through 1734 is programmably connected to the input terminal of one secondary NAND gate 1765 of maximal count circuit 1760 via an single PIP 1725(71) and associated I/O line 1727. Similarly, each bus line 1731 through 1734 is programmably connected to the input terminal of one secondary logic gate 1755 of sequence control circuit 1750 via a single PIP 1725(72) and associated I/O line 1726. In this embodiment, the number of secondary NAND gates 1765 feeding primary logic gate 1763 (e.g., four) may equal the number of bus lines in first bus 1730 (i.e., the number of flip-flops of PSR 1700, two of which are not shown). Likewise, the number of secondary logic gates 1755 feeding primary logic gate 1753 may equal the number of bus lines in first bus 1730, plus one additional secondary logic gate 1755 to receive signals from maximal count circuit 1760.

Figure 18:
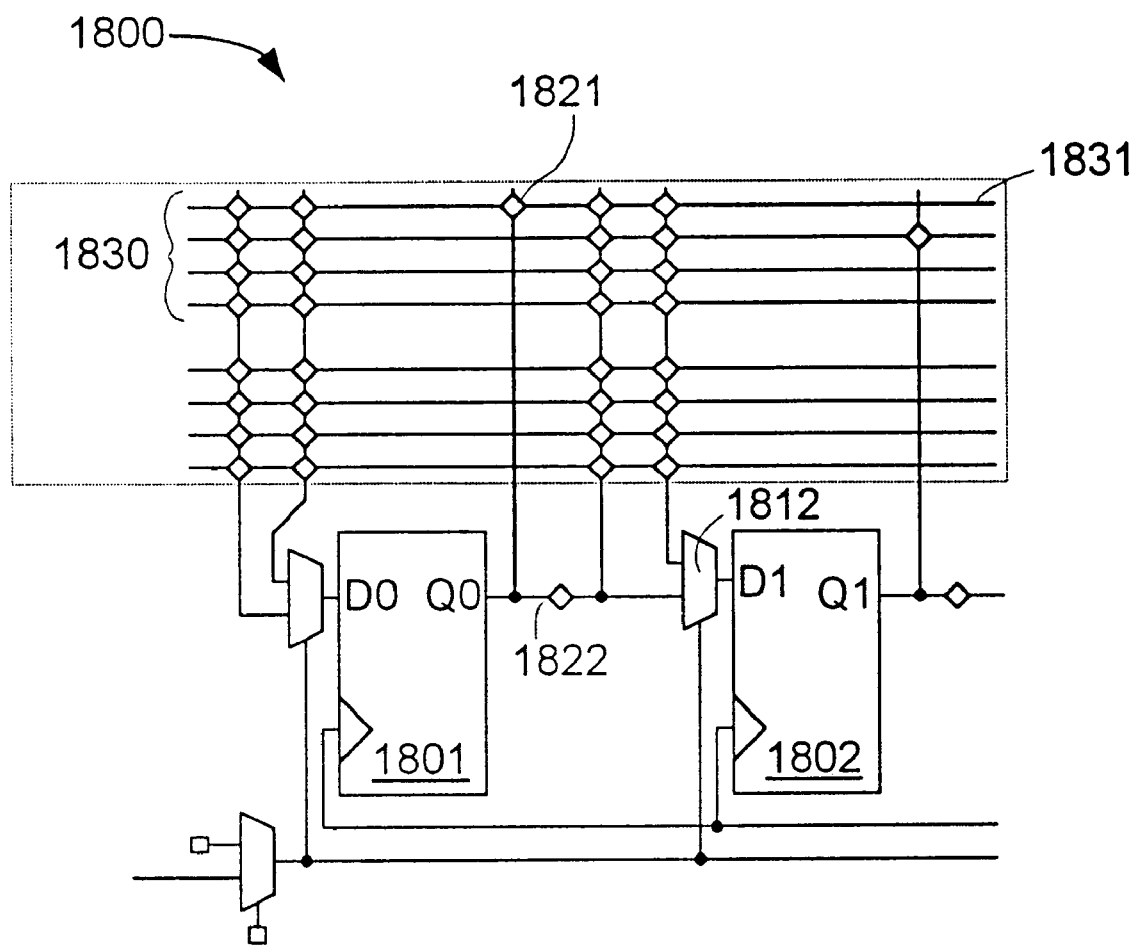
FIG. 18 is a schematic diagram showing a portion of a programmable shift register in accordance with a third embodiment of the present invention.

In another alternative embodiment shown in FIG. 18, PSR 1800 includes a PIP 1820 connected between the Q0 output terminal of flip-flop 1801 and the lower input terminal of multiplexer 1812. PIP 1820 selectively enables signal transmission directly from flip-flop 1801 to flip-flop 1802 (through multiplexer 1812), thereby reducing signal delay. Further, PIP 1821 programmably connects the Q0 output terminal to bus line 1831 of bus 1830. When direct signal transmission through PIP 1822 is selected, PIP 1821 can be set to disconnect the Q0 output terminal from bus line 1831.

The alternative embodiments shown in FIGS. 17 and 18 illustrate that several modifications to the disclosed invention are possible. Therefore, the spirit and scope of the appended claims should not be limited to the description of the preferred embodiments contained herein.

What is claimed is:

1. A programmable shift register comprising:
   a plurality of flip-flops, each flip-flop having a data input terminal and a data output terminal; and
   a programmable interconnect circuit for receiving data signals transmitted from the data output terminals of the plurality of flip-flops, and for programmably connecting selected data signals to selected data input terminals of the plurality of flip-flops.

2. The programmable shift register according to claim 1, wherein the programmable interconnect circuit comprises:
   a bus including a plurality of bus lines, each bus line receiving a data signal transmitted from the output terminal of an associated flip-flop of the plurality of flip-flops; and
   a plurality of switches, each switch being selectively enabled to route a data signal from one of the plurality of bus lines to the data input terminal of an associated flip-flop.

3. The programmable shift register according to claim 2, wherein each bus line has a fixed connection to the output terminal of its associated flip-flop.

4. The programmable shift register according to claim 2, wherein each bus line is programmably connected to the output terminal of its associated flip-flop.

5. The programmable shift register according to claim 2, wherein each switch comprises a volatile memory cell controlling a pass transistor.

6. The programmable shift register according to claim 5, wherein the pass transistor is a CMOS transistor.

7. The programmable shift register according to claim 2, further comprising a plurality of input/output (I/O) lines for transmitting data signals from the programmable interconnect circuit to the input terminals of the plurality of flip-flops, wherein each I/O line is programmably connected to the plurality of bus lines by an associated switch of the plurality of switches.

8. The programmable shift register according to claim 7, wherein each of the plurality of switches comprises a pass transistor having a control terminal connected to the output terminal of a de-multiplexer.

9. The programmable shift register according to claim 7, further comprising a mode control circuit programmably connecting one of a first I/O line and a second I/O line to the input terminal of an associated one of the plurality of flip-flops.

10. The programmable shift register according to claim 9, wherein the mode control circuit comprises a first multiplexer having a first input terminal connected to the first I/O line, a second input terminal connected to the second I/O line, and an output terminal connected to the input terminal of the associated one of the plurality of flip-flops.

11. The programmable shift register according to claim 10, wherein the mode control circuit further comprises a second multiplexer having a first input terminal connected to a memory cell, a second input terminal and an output terminal, wherein the output terminal of the second multiplexer is connected to a select input terminal of the first multiplexer.

12. A programmable shift register comprising:
   a plurality of flip-flops, each flip-flop having a data input terminal and a data output terminal; and
   a programmable next-state control circuit for receiving data signals transmitted from the output terminals of a selected group of the plurality of flip flops, and for generating a next-state control signal;
   wherein the next-state control signal is programmably connected to the input terminal of a selected one of the plurality of flip-flops.

13. The programmable shift register according to claim 12, further comprising a programmable interconnect circuit for receiving the data signals transmitted from the data output terminals of the plurality of flip-flops, for programmably connecting selected data signals to the programmable next-state control circuit, and for programmably connecting the next-state control signal generated by the programmable next-state control circuit to the selected one of the plurality of flip-flops.

14. The programmable shift register according to claim 13, wherein the programmable interconnect circuit comprises:
   a first bus including a plurality of bus lines, each bus line receiving a data signal transmitted from the output terminal of an associated flip-flop of the plurality of flip-flops;
   a second bus including a bus line for receiving the next-state control signal; and
   a plurality of switches including a first switch programmably connecting one of the plurality of first bus lines to the next-state control circuit, and a second switch for selectively routing the next-state control signal to the input terminal of an associated flip-flop.

15. The programmable shift register according to claim 13, wherein each of the plurality of first bus lines has a fixed connection to the output terminal of its associated flip-flop.

16. The programmable shift register according to claim 13, wherein each of the plurality of first bus line is programmably connected to the output terminal of its associated flip-flop.

17. The programmable shift register according to claim 16, further comprising a mode control circuit programmably connecting one of a first I/O line and a second I/O line to the input terminal of an associated one of the plurality of flip-flops, wherein both the first I/O line and the second I/O line are programmably connected to the first bus line and the second bus line.

18. The programmable shift register according to claim 13, wherein the next-state control circuit comprises a sequence circuit including a first primary logic gate and a plurality of first secondary logic gates, each of the first secondary logic gates being programmably connected to the plurality of first bus lines and having output terminals connected to input terminals of the first primary logic gate.

19. The programmable shift register according to claim 18, wherein the next-state control circuit further comprises a maximal count circuit including a second primary logic gate and a plurality of second secondary logic gates, each of the second secondary logic gates being programmably connected to the plurality of first bus lines and having output terminals connected to input terminals of the second primary logic gate, wherein an output terminal of the second primary logic gate is connected to the input terminal of one of the plurality of first secondary logic gates.

20. The programmable shift register according to claim 19, wherein the next-state control circuit further comprises:

a skip-state circuit including a plurality of input terminals and an output terminal, each input terminal being connected to one of the plurality of first bus lines;

an OR gate having a first input terminal connected to the output terminal of the skip-state circuit, and a second input terminal connected to a memory cell; and an AND gate having a first input terminal connected to an output terminal of the OR gate, and a second input terminal connected to an output terminal of the first primary logic gate.

21. The programmable shift register according to claim 20, wherein the skip-state circuit comprises a third primary logic gate and a plurality of programmable input terminals, each programmable input terminal includes a first circuit for selectively passing a data signal to the third primary logic gate, and a second circuit for selectively inverting the data signal.

* * * * *